United States Patent
Aweya et al.

(10) Patent No.: US 8,913,632 B2
(45) Date of Patent: Dec. 16, 2014

(54) METHOD AND SYSTEM FOR FREQUENCY SYNCHRONIZATION

(75) Inventors: James Aweya, Abu Dhabi (AE); Saleh Al Araji, Sharjah (AE)

(73) Assignees: Khalifa University of Science, Technology and Research, Adu Dhabi (AE); British Telecommunications plc, London (GB); Emiates Telecommunications Corporation, Adu Dhabi (AE)

( * ) Notice: Subject to any disclaimer, the term of this patent is extended or adjusted under 35 U.S.C. 154(b) by 456 days.

(21) Appl. No.: 13/204,079

(22) Filed: Aug. 5, 2011

(65) Prior Publication Data

US 2013/0034197 A1 Feb. 7, 2013

(51) Int. Cl.
H04J 3/06 (2006.01)

(52) U.S. Cl.
CPC ............ *H04J 3/0664* (2013.01); *H04J 3/0667* (2013.01)
USPC .......................................... 370/503; 375/354

(58) Field of Classification Search
CPC .. H04W 56/001; H04W 56/0015; H04L 7/00; H04J 3/0635
USPC ............................ 370/324, 350, 503; 375/354
See application file for complete search history.

(56) References Cited

U.S. PATENT DOCUMENTS

| | | | |
|---|---|---|---|
| 7,656,985 B1 * | 2/2010 | Aweya et al. ................ | 375/373 |
| 2003/0117899 A1 * | 6/2003 | Eidson ........................ | 368/46 |
| 2007/0258550 A1 * | 11/2007 | Wang et al. .................. | 375/354 |
| 2011/0035511 A1 * | 2/2011 | Biederman ................... | 709/248 |
| 2011/0153869 A1 * | 6/2011 | Bryant et al. ................. | 709/248 |
| 2011/0161701 A1 * | 6/2011 | Blixt et al. ................... | 713/320 |
| 2012/0099432 A1 * | 4/2012 | Bercovich et al. ........... | 370/235 |
| 2012/0136956 A1 * | 5/2012 | Khoury et al. ............... | 709/208 |
| 2012/0275501 A1 * | 11/2012 | Rotenstein ................... | 375/220 |
| 2013/0010813 A1 * | 1/2013 | Ruffini et al. ................ | 370/503 |

OTHER PUBLICATIONS

Mills, D., "Network Time Protocol (Version 3) Specification, Implementation and Analysis", IETF RFC 1305, Mar. 1992.
IEEE Standard for a Precision Clock Synchronization Protocol for Networked Measurement and Control Systems, IEEE 1588-2008.
IEEE Standard for a Precision Clock Synchronization Protocol for Networked Measurement and Control Systems, IEEE 1588-2002.
IEEE 802.3-2008: IEEE Standard for Information technology—Specific requirements—Part 3: Carrier Sense Multiple Access with Collision Detection (CMSA/CD) Access Method and Physical Layer Specifications.
T. Neagoe M. Hamdi and V. Cristea, "Frequency Compensated, Hardware IEEE-1588 Implementation," IEEE International Symposium on Industrial Electronics, Jul. 9-13, 2006, pp. 240-245.
S. Balasubramanian, K. R. Harris, A. Moldovansky, "A Frequency Compensate Clock for Precision Synchronization Using IEEE1588 and its Applications to Ethernet" IEEE-1588 Workshop, Sep. 2003.
R. E. Best, Phase-Locked Loops. Design, Simulation, and Applications, McGraw-Hill, New York, Fourth Edition, 1999.

(Continued)

*Primary Examiner* — Paul H Masur
(74) *Attorney, Agent, or Firm* — Calfee, Halter & Griswold LLP

(57) ABSTRACT

Systems and methods of synchronizing the frequency of a slave clock to that of a master clock using time-stamps in transmissions from a master device having the master clock, determining an error signal, and adjusting the frequency of the slave clock based on said error signal.

30 Claims, 23 Drawing Sheets

(56) References Cited

OTHER PUBLICATIONS

G. F. Franklin, J. D. Powell and A. Emami-Naeini, Feedback Control of Dynamic Systems, Addison-Wesley Reading, Massachusetts, 1994.

J. H. Cho et al. "A Novel Method for Providing Precise Time Synchronization in a Distributed Control System Using Boundary Clock" IEEE Transactions on Instrumentation and Measurement vol. 58, No. 8, Aug. 2009.

Lee & Edison "Workshop on IEEE-1588, Standard for a Precision Clock Synchronization Protocol for Networked Measurement and Control Systems", NISTIR 7070, Sep. 2003.

Intel White Paper "Hardware-Assisted IEEE 1588* Implementation in the Intel ICP46X Product Line", Document No. 305068, Mar. 2005.

Intel Application Note "Utilizing IEEE 1588 with Intel EP80579 Integrated Processor Product Line", May 2009.

T. Neagoe and M. Hamdi, "A Hardware IEEE-1588 Implementation with Processor Frequency Control," Arrow Electronics White Paper, Aug. 2006.

* cited by examiner

| Octets | Bits 7 6 5 4 3 2 1 0 |
|---|---|
| 34 | header |
| 10 | originTimestamp |
| 2 | currentUtcOffset |
| 1 | reserved |
| 1 | grandmasterPriority1 |
| 4 | grandmasterClockQuality |
| 1 | grandmasterPriority2 |
| 8 | grandmasterIdentity |
| 2 | stepsRemoved |
| 1 | timeSource |

Figure 3

PRIOR ART

Timestamp
The Timestamp type represents a positive time with respect to the epoch.

```
struct Timestamp
{
        UInteger48 secondsField;
        UInteger32 nanosecondsField;
};
```

The secondsField member is the integer portion of the timestamp in units of seconds.

The nanosecondsField member is the fractional portion of the timestamp in units of nanoseconds.

The nanosecondsField member is always less than $10^9$.

For example:
+2.000000001 seconds is represented by secondsField = 0000 0000 $0002_{16}$ and nanosecondsField = 0000 $0001_{16}$.

Figure 7
PRIOR ART

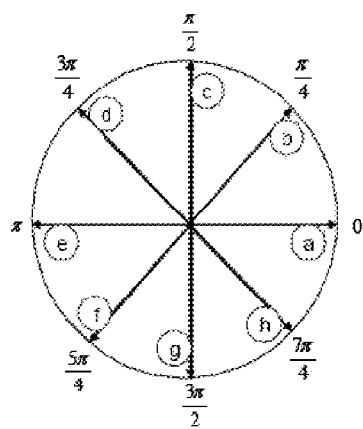
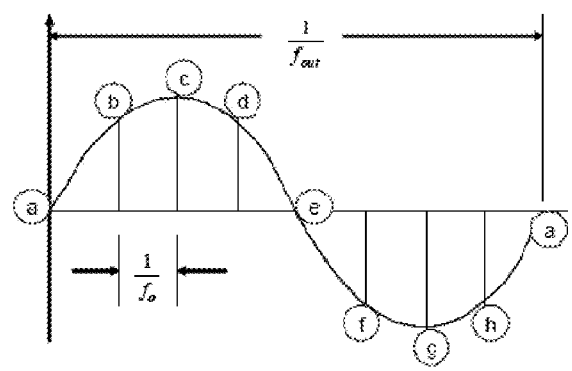
Phase Output from Phase Accumulator
Sine Output from Sine Computation Function
Figure 21

Frequency of generation is $$f_{\Delta T} = f_s / \Delta T$$

(The same idea applies to the receiver)

$e$ is in clock ticks (timestamp unit)

METHOD AND SYSTEM FOR FREQUENCY SYNCHRONIZATION

FIELD OF THE INVENTION

The present invention relates to a method and system for frequency synchronization. It is particularly, but not exclusively, concerned with a method and system for synchronizing the frequency of a slave clock to the frequency of a master clock in another device.

BACKGROUND OF THE INVENTION

Synchronization is critical for telecommunication system performance. Frequency and time (time-of-day or wall-clock) synchronization is crucial for mobile wireless networks because the radios used in these networks operate in very strict bands that need separation to avoid channel interference which reduces the call quality and network capacity. Poor synchronization has also negative impact for the handover between base stations.

Mobile handsets generally derive the accurate frequency that they transmit and receive from the base stations. If the transmission frequencies are not very closely matched between adjacent cell sites, then "clicks" can occur when the call is being handed over (that is, switches) between base stations. In the worst case, the call would drop because the mobile handset would not be able to immediately lock onto and acquire the new signal.

Failure to meet the timing requirements of the relevant standards would cause performance degradation for the radio access channels. In particular, this failure could compromise cell handover (especially for travelling mobile stations) and producing excess of dropped calls.

With increasing interest in packet networks as a common mode of communication, packet-based synchronization solutions are in high demand as alternative to PDH (plesiochronous digital hierarchy)/SDH (synchronous digital hierarchy) and GPS based solutions. Equipment vendors and telecom service providers are looking for new packet synchronization solutions with very high accuracies beyond those attainable using the traditional packet methods like Network Time Protocol (NTP) (see Mills, D., "Network Time Protocol (Version 3) Specification, Implementation and Analysis", IETF RFC 1305, March 1992).

It is desirable that such new solution are also be designed for applications (e.g., base stations) that cannot bear the cost of a GPS receiver at each node, or for which GPS signals are inaccessible (for example due to location).

The IEEE Standard 1588 Precision Time Protocol (PTP) (IEEE Standard for a Precision Clock Synchronization Protocol for Networked Measurement and Control Systems, IEEE 1588-2008), is the latest addition in packet timing technology. Originally designed to provide precise timing for critical industrial automation applications it is now providing the highest level of accurate frequency and time to wireless backhaul networks. The backhaul portion of the network comprises the intermediate links between the core network, or backbone, of the network and the base stations. Currently standardized in 2008 as Version 2 (IEEE-1588v2, superseding IEEE 1588-2002), PTP is designed to overcome the Network Time Protocol (NTP) latency and jitter issues, providing accuracy in the nanosecond range.

Base stations have traditionally met synchronization requirements by locking their internal oscillators to a recovered clock from the T1/E1 TDM (time division multiplexing) backhaul connection. While Ethernet has proven to be a ubiquitous and inexpensive medium for connectivity, it has not been well-suited for applications requiring precise synchronization. When the backhaul transitions from TDM to Ethernet, the base station becomes isolated from its traditional network sync feed. New base station designs are incorporating IEEE 1588 PTP slave clocks to meet the 50 ppb (parts per billion) accuracy requirement. These PTP slave clocks in the base stations rely on access to a PTP grandmaster clock deployed in a mobile switching center (MSC). Sync and Follow_Up packets flow from the grandmaster clock to the slave clocks in the base stations.

IEEE 1588v2 PTP is fully compatible with all Ethernet and IP networks. Additionally, the protocol is designed to enable a properly designed network to deliver frequency and phase or time with precision rivalling a GPS receiver. An IEEE 1588v2 PTP Technique for Frequency Synchronization implementation can supply FDD (frequency division duplexing) and TDD (time division duplexing) radio systems and CES-based (circuit emulation services) transport systems with the synchronization signals they require as illustrated in FIG. 1. This greatly reduces the costs of clocking all wireless base station equipment using other means.

A primary reference is a source of time and or frequency that is traceable to international standards. A recognized standard time source is a source external to PTP that provides time and/or frequency as appropriate that is traceable to the international standards laboratories maintaining clocks that form the basis for the International Atomic Time (TAI) and Universal Coordinated Time (UTC) timescales. Examples of these are Global Positioning System (GPS), NTP, and National Institute of Standards and Technology (NIST) timeservers.

Although IEEE 1588v2 PTP systems add a small amount of additional traffic to the network load, they have several advantages. First, they work in the data path, and also benefit from the redundancy and resiliency mechanisms of the network, resulting in "always on" operation. Next, multiple transmission paths reduce redundant clock system costs. They also use a single synchronization session for all base station traffic. IEEE 1588v2 PTP supports any generic packet-based transport (such as IP, MPLS). The protocol also features configurable synchronization packet rates for network conditions to maintain accuracy.

The transmission of the clock information over a packet network eliminates the need for alternative mechanisms, such as GPS or prohibitively expensive oscillators placed at the receiving nodes. This provides significant cost savings in network equipment as well as in ongoing installation and maintenance. This synchronization solution transmits dedicated timing packets, which flow along the same paths with the data packets, reducing the cost of synchronization and simplifying implementation.

To ensure that packet technologies (Ethernet, IP, MPLS) have the necessary attributes to be truly carrier grade, operators and vendors are introducing several key technologies for the transport of timing and synchronization over packet networks. Of these IEEE 1588v2 PTP is perhaps the most important because it provides both frequency and time distribution.

The grandmaster is the root timing reference in a domain and transmits synchronization information to the clocks residing in its domain. In IEEE 1588v2 PTP messages are categorized into event and general messages. All IEEE 1588 PTP messages have a common header as shown in FIG. 2.

Event messages are timed messages in that an accurate timestamp is generated at both transmission and receipt of each message. Event messages have to be accurately timestamped since the accuracy in transmission and receipt timestamps directly affects clock distribution accuracy. A timestamp event is generated at the time of transmission and reception of any event message. General messages are not required to be timestamped. The set of event messages consists of Sync, Delay_Req (both of which have the format shown in FIG. 4), Pdelay_Req, and Pdelay_Resp. The set of general messages consists of Announce (which has the format shown in FIG. 3), Follow_Up (which has the format shown in FIG. 5), Delay_Resp (which has the format shown in FIG. 6), Pdelay_Resp_Follow_Up, Management, and Signalling.

The Sync, Delay_Req, Follow_Up, and Delay_Resp messages are used to generate and communicate the timing information needed to synchronize ordinary and boundary clocks using the delay request-response mechanism. A Sync message is transmitted by a master to its slaves and either contains the exact time of its transmission or is followed by a Follow_Up message containing this time. In a two-step ordinary or boundary clock, the Follow_Up message communicates the value of the departure timestamp for a particular Sync message.

A Delay_Req message is a request for the receiving node to return the time at which the Delay_Req message was received, using a Delay_Resp message.

The format of the PTP message timestamp fields is shown in FIG. 7. A timestamp is the current time of an event that is recorded by a device. IEEE 1588 PTP allows for two different types of timestamping methods, either one step or two-step. One-step clocks update time information within event messages (Sync and Delay-Req) on-the-fly, while two-step clocks convey the precise timestamps of packets in general messages (Follow_Up and Delay-Resp).

The basic pattern of synchronization message exchange is illustrated in FIG. 8. The message exchange pattern is as follows. The master 101 sends a Sync message (M101) to the slave 102 and notes the time T1 at which it was sent. The slave 102 receives the Sync message and notes the time of reception T2. The master 101 conveys to the slave 102 the timestamp T1 by one of two ways: 1) Embedding the timestamp T1 in the Sync message. This requires some sort of hardware processing (i.e., hardware timestamping) for highest accuracy and precision. 2) Embedding the timestamp T1 in a Follow_Up message (M102). Next, the slave 102 sends a Delay_Req message (M103) to the master 101 and notes the time T3 at which it was sent. The master 101 receives the Delay_Req message (M103) and notes the time of reception T4. The master 101 conveys to the slave 102 the timestamp T4 by embedding it in a Delay_Resp message (M104).

At the end of this PTP message exchange, the slave possesses all four timestamps {T1, T2, T3, T4}. These timestamps may be used to compute the offset of the slave's clock with respect to the master and the mean propagation time of messages between the two clocks. The computation of offset and propagation time assumes that the master-to-slave and slave-to-master propagation times are equal.

The IEEE 1588 PTP based frequency recovery technique described in Section 12.1 of IEEE 1588-2008 Standard requires estimation of the mean path delay between server (master) and client (slave) which may include accounting for path asymmetry. In order to accurately synchronize to their master, slave clocks must individually determine the network transit time of the PTP messages. The network transit time is determined indirectly by measuring round-trip time from each slave to its master.

Like all message-based time transfer protocols, PTP time accuracy is degraded by asymmetry in the paths taken by event messages. Any asymmetry in the forward and reverse path propagation times and introduces an error into the computed value of the link delay. Asymmetry can be introduced in the physical layer, e.g., via transmission media asymmetry, by bridges and routers, and in large systems by the forward and reverse paths traversed by event messages taking different routes through the network. Systems should be configured and components selected to minimize these effects guided by the required timing accuracy. In single subnet systems with distances of a few meters, asymmetry is not usually a concern for time accuracies above a few 10 s of ns. Asymmetry is not detectable by PTP; however, if known, PTP corrects for asymmetry. If two-step clocks are used, then the network has to be designed such that the general message takes the same path as the event message through a transparent clock. Failure to do this will result in a condition where the transparent clock does not calculate path delay properly. This condition is undetectable and may introduce additional jitter and wander, but it will not break the protocol.

Other IEEE 1588 based techniques (such as those discussed in T. Neagoe and M. Hamdi, "A Hardware IEEE-1588 Implementation with Processor Frequency Control," Arrow Electronics White Paper; T. Neagoe M. Hamdi and V. Cristea, "Frequency Compensated, Hardware IEEE-1588 Implementation," IEEE International Symposium on Industrial Electronics, 9-13 Jul. 2006, pp. 240-245 and S. Balasubramanian, K. R. Harris, A. Moldovansky, "A Frequency Compensate Clock for Precision Synchronization Using IEEE1588 and its Applications to Ethernet" IEEE-1588 Workshop, September 2003 assume that the PTP GrandMaster Clock (GMC) sends Sync messages at fixed intervals, an assumption which might not necessary hold true in practice. The above receiver clock recovery mechanisms are designed based on this assumption.

An object of the present invention is to provide a method and system for frequency synchronization that allows one or more receivers (slaves) to frequency synchronize to a transmitter (master). Other applications of frequency synchronization are in process and manufacturing industries like paper mills, printing presses, automation and robotic systems, test and measurement instruments and systems, etc.

Another object of the present invention is to provide a synchronization technique based on, for example, the IEEE 1588 Precision Time Protocol (PTP) that allows frequency to be distributed over a packet network from a PTP server (master) to synchronization clients (slaves).

SUMMARY OF THE INVENTION

An exemplary aspect of the present invention provides a method of synchronizing the frequency of a slave clock in a slave device to a master clock in a master device, the method including the steps of:

a) receiving in the slave device a first message from said master device having a first time-stamp which is a time-stamp of said master clock indicating the time of sending of said first message;

b) extracting said time-stamp from said message and initializing a counter in the slave device which counts an output of said slave clock;

c) receiving in the slave device a further message from said master device and reading the value of said counter at the time of receipt of said further message;

d) extracting a further time-stamp which is the precise time of sending of the further message according to said master clock;

e) determining an error signal which is representative of the difference between said value of the counter and the difference between said first and further time-stamps; and f) adjusting the frequency of said slave clock based on said error signal.

A further exemplary embodiment of the present invention provides an apparatus for synchronizing the frequency of a clock in a slave device which is communicatively coupled to a master device, the clock comprising: an oscillator; and a pulse counter counting pulses from said oscillator, the apparatus comprising: a receiver receiving messages from said master device; a time-stamp extraction device for extracting time-stamps applied to said messages by said master device; and a detector for detecting a difference between a time-stamp extracted from said messages and an output of said pulse counter and generating an error signal based on said difference, wherein said oscillator adjusts its frequency of oscillation based on said error signal.

A further exemplary embodiment of the present invention provides an apparatus for synchronizing the frequency of a clock in a slave device which is communicatively coupled to a master device, the clock comprising: an oscillator; and a pulse counter counting pulses from said oscillator, the apparatus comprising: a receiver receiving messages from said master device; a time-stamp extraction device for extracting time-stamps applied to said messages by said master device; and a detector for detecting a difference between a time-stamp extracted from said messages and an output of said pulse counter and generating an error signal based on said difference, wherein: the receiver receives a first message from said master device having a first time-stamp which is a time-stamp of said master clock indicating the time of sending of said first message and initializes said pulse counter on receipt of said first message; the time-stamp extraction device extracts said time-stamp from said message; the receiver receives a further message from said master device and the detector reads the value of said pulse counter at the time of receipt of said further message; the time-stamp extraction device extracts a further time-stamp which is the precise time of sending of the further message according to said master clock; the detector determines said error signal based on the difference between said value of the counter and the difference between said first and further time-stamps; and said oscillator adjusts its frequency of oscillation based on said error signal.

BRIEF DESCRIPTION OF THE DRAWINGS

Embodiments of the invention will now be described by way of example with reference to the accompanying drawings in which:

FIG. 3 shows the format of an Announce message in IEEE 1588 PTP and has already been described;

FIG. 7 shows the format of a timestamp in an IEEE 1588 PTP message and has already been described;

FIG. 21 shows the phase accumulation of a sample sine wave;

DETAILED DESCRIPTION

Accordingly, at its broadest, a first aspect of the present invention provides a method of synchronising the frequency of a slave clock to that of a master, preferably using a packet network.

A first aspect of the present invention preferably provides a method of synchronizing the frequency of a slave clock in a slave device to a master clock in a master device, the method including the steps of:

a) receiving in the slave device a first message from said master device having a first time-stamp which is a time-stamp of said master clock indicating the time of sending of said first message;

b) extracting said time-stamp from said message and initializing a counter in the slave device which counts an output of said slave clock;

c) receiving in the slave device a further message from said master device and reading the value of said counter at the time of receipt of said further message;

d) extracting a further time-stamp which is the precise time of sending of the further message according to said master clock;

e) determining an error signal which is representative of the difference between said value of the counter and the difference between said first and further time-stamps; and f) adjusting the frequency of said slave clock based on said error signal.

Figure 1:
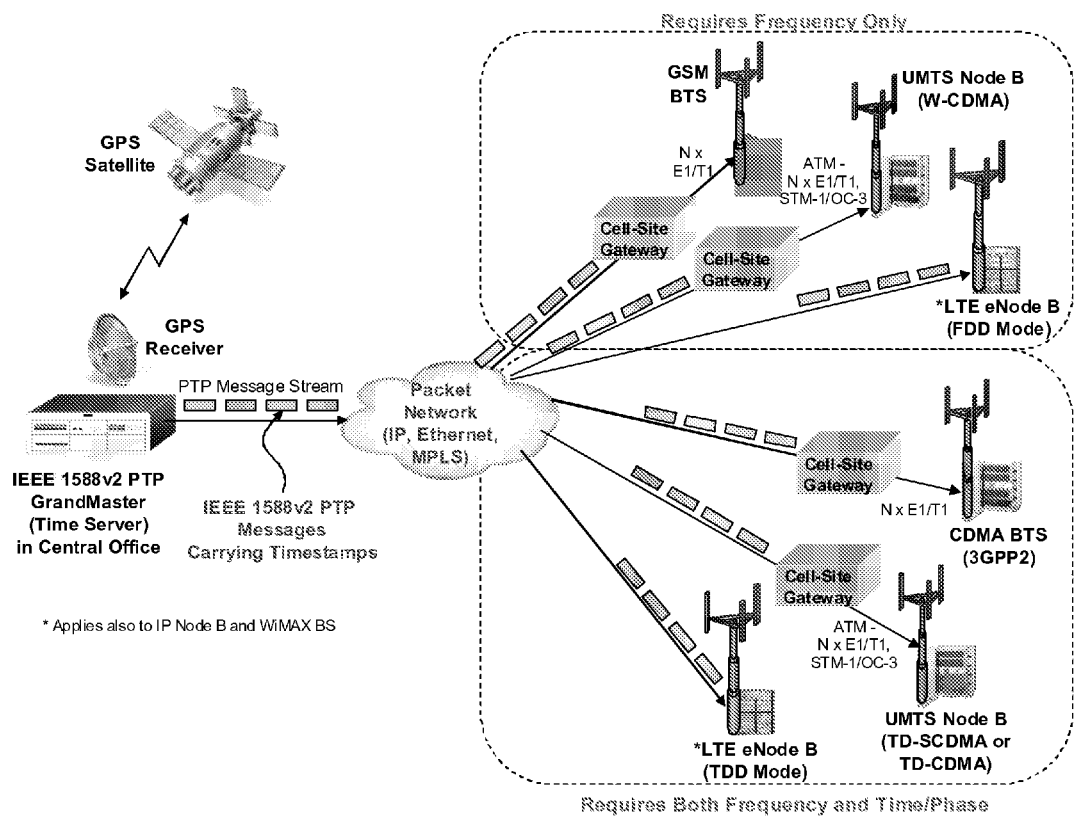
FIG. 1 shows the operation of frequency and time synchronization using IEEE 1588v2 Precision Time Protocol as known in the prior art and has already been described.
Figure 2:
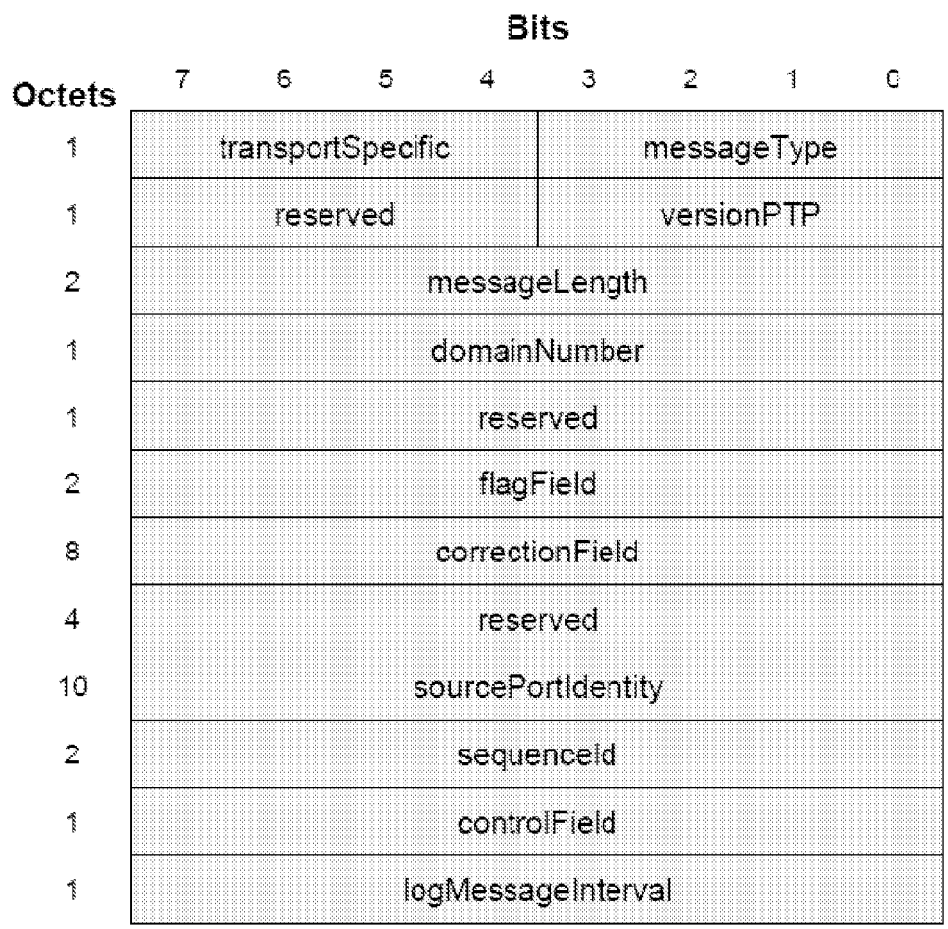
FIG. 2 shows the common message header for an IEEE 1588 PTP message and has already been described.
Figure 4:
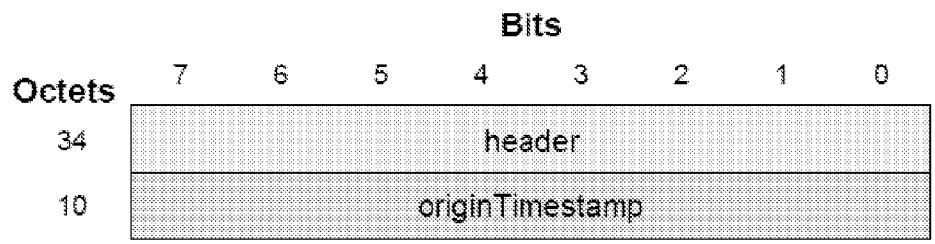
FIG. 4 shows the format of a Sync or Delay_Req message in IEEE 1588 PTP and has already been described.
Figure 5:
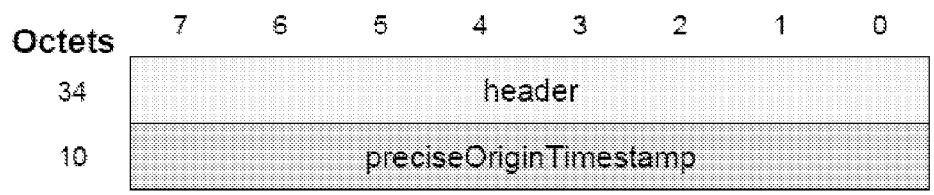
FIG. 5 shows the format of a Follow_Up message in IEEE 1588 PTP and has already been described.
Figure 6:
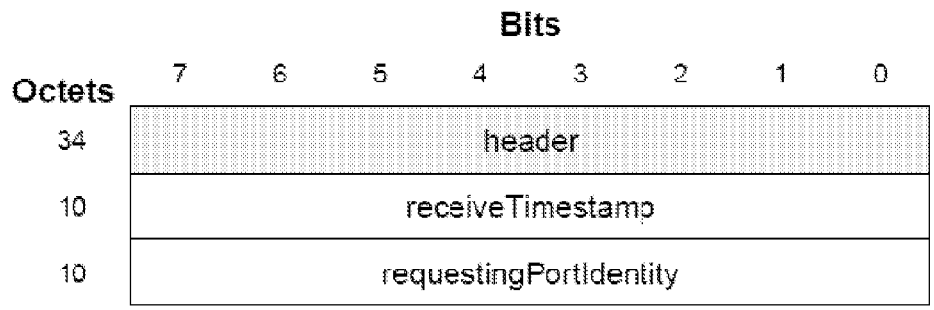
FIG. 6 shows the format of a Delay_Resp message in IEEE 1588 PTP and has already been described.
Figure 8:
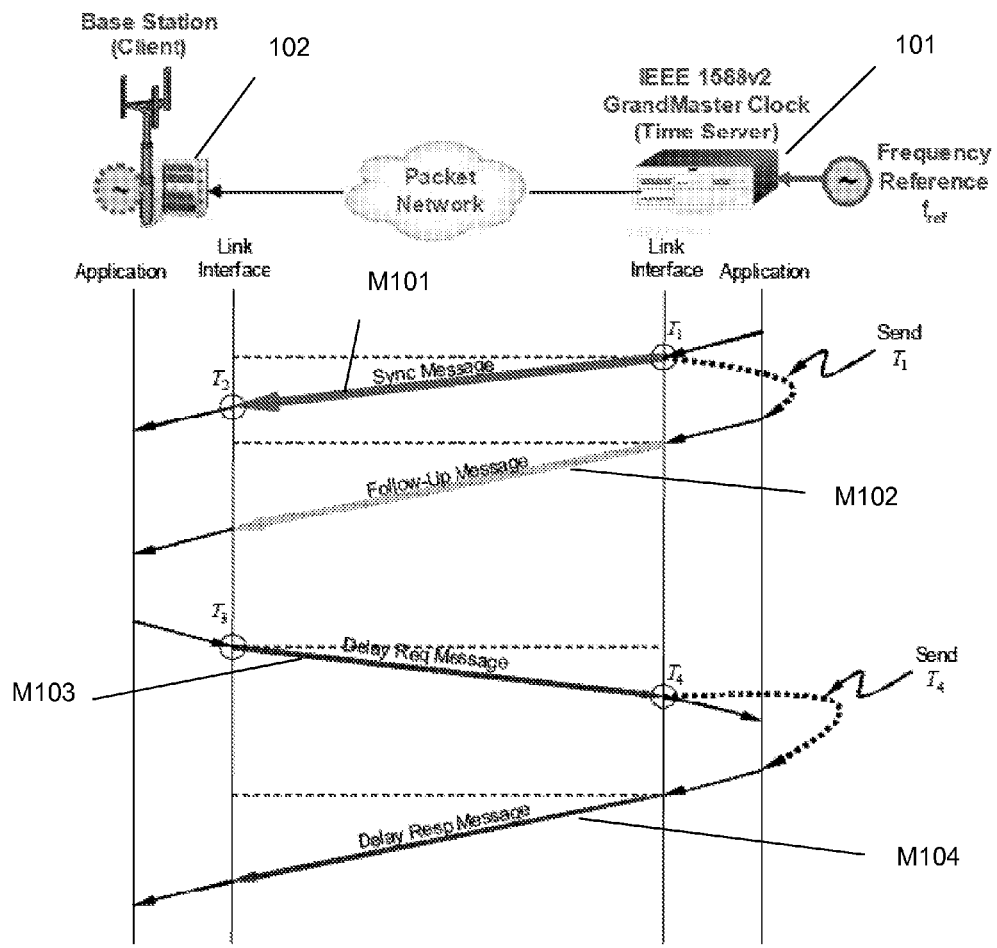
FIG. 8 shows the basic pattern of synchronization message exchange in IEEE 1588 PTP and has already been described.

Since the method of this aspect involves only frequency synchronization (i.e., syntonization), the full message exchange as described above and as illustrated in FIG. 8 is not required before synchronization can be achieved.

In certain embodiments, the method may use a "one step clock" algorithm for synchronization. This is possible where the master device is able to accurately time-stamp an outgoing message at the time of sending. In this situation, the first time-stamp records the precise time of sending of said first message according to said master clock.

Furthermore, if the master device is able to accurately time-stamp a message at the time of sending, said step d) of extracting may extract said further time-stamp from said further message.

In other embodiments, in particular where the master device is unable to include a precise time-stamp in the message when it is sent, a "two step clock" algorithm may be used for synchronization. In this situation the first time-stamp records an approximate time of sending of said first message according to said master clock and the method further includes the step of, after initializing said counter, receiving a second message from said master device which contains a second time-stamp which records the precise time of sending of said first message according to said master clock.

Furthermore, the method may further include the step of, after receiving said further message, receiving a follow up message, wherein said step d) extracts said further time-stamp from said follow-up message.

Preferably the method repeats steps c) to f). This repetition may allow the synchronization of frequency to be improved or maintained with each subsequent message. This repetition may take place at all times when the slave device is operational and/or may be on a regular basis.

Preferably the error signal is representative of a phase difference between said slave clock and said master clock. The error signal can then be used to adjust the phase of the slave clock.

The method may further include the step of filtering said error signal prior to said step of adjusting.

Preferably said master clock is synchronized with a recognized standard time source such as UTC or GPS.

In a particularly preferred embodiment, the messages are messages according to the IEEE 1588 Precision Time Protocol. In particular, in the "one step clock" approach, the messages may be Sync messages according to the IEEE 1588 Precision Time Protocol. IEEE 1588 PTP is rapidly gaining traction as the technology of choice to deliver synchronization to remote telecom elements over Ethernet (IEEE 802.3 [5]) and other packet-based backhaul connections.

Alternatively, in the "two step clock" approach, said first message and said further message are Sync messages according to the IEEE 1588 Precision Time Protocol and said second message and said follow up message are Follow_Up messages according to the IEEE 1588 Precision Time Protocol. The Follow_Up messages contain, as part of the message, the time-stamp for the time of sending of the Sync message which they follow.

Embodiments of the above first aspect may include some, all or none of the above optional or preferred features, to the extent that such features are not mutually exclusive.

The method of this aspect is preferably implemented in an apparatus according to the second aspect below (including some all or none of the optional or preferred features of that aspect), but need not be so.

At its broadest, a second aspect of the present invention provides a system for frequency synchronization that allows one or more receivers (slaves) to frequency synchronize to a transmitter (master).

Accordingly a second aspect of the present invention preferably provides an apparatus for synchronizing the frequency of a clock in a slave device which is communicatively coupled to a master device, the clock comprising:
an oscillator; and
a pulse counter counting pulses from said oscillator,
the apparatus comprising:
a receiver receiving messages from said master device;
a time-stamp extraction device for extracting time-stamps applied to said messages by said master device; and
a detector for detecting a difference between a time-stamp extracted from said messages and an output of said pulse counter and generating an error signal based on said difference,
wherein said oscillator adjusts its frequency of oscillation based on said error signal.

The apparatus is therefore able to produce an error signal which allows the frequency of the oscillator (and therefore the clock in the slave device) to be adjusted so as to bring it closer to the frequency of a clock in the master device which is supplying said time-stamps. Preferably the error signal allows the clock of the slave device to completely synchronize with the frequency of the clock in the master device.

The apparatus of this aspect preferably operates according to a method according to the above first aspect (including some, all or none of the optional and preferred features of that aspect), but need not do so.

Preferably the apparatus operates such that:
the receiver receives a first message from said master device having a first time-stamp which is a time-stamp of said master clock indicating the time of sending of said first message and initializes said pulse counter on receipt of said first message;
the time-stamp extraction device extracts said time-stamp from said message;
the receiver receives a further message from said master device and the detector reads the value of said pulse counter at the time of receipt of said further message;
the time-stamp extraction device extracts a further time-stamp which is the precise time of sending of the further message according to said master clock; and
the detector determines said error signal based on the difference between said value of the counter and the difference between said first and further time-stamps.

Since the apparatus of this aspect involves only frequency synchronization (i.e., syntonization), the full message exchange as described above and as illustrated in FIG. 8 is not required before synchronization can be achieved.

In certain embodiments, the apparatus may use a "one step clock" algorithm for synchronization. This is possible where the master device is able to accurately time-stamp an outgoing message at the time of sending. In this situation, the first time-stamp records the precise time of sending of said first message according to said master clock.

Furthermore, if the master device is able to accurately time-stamp a message at the time of sending, the time-stamp extraction device extracts said further time-stamp from said further message.

In other embodiments, in particular where the master device is unable to include a precise time-stamp in the message when it is sent, a "two step clock" algorithm may be used for synchronization. In this situation the first time-stamp records an approximate time of sending of said first message according to said master clock and the receiver receives a second message from said master device which contains a second time-stamp which records the precise time of sending of said first message according to said master clock.

Furthermore, after receiving said further message, the receiver may receive a follow up message and the time-stamp extraction device extracts said further time-stamp from said follow-up message.

Preferably the apparatus receives a plurality of said messages from the master device and adjusts the frequency of the oscillator on receipt of each message. This may allow the synchronization of frequency to be improved or maintained with each subsequent message. The messages may be received at all times when the slave device is operational and/or may be on a regular basis.

Preferably the error signal is representative of a phase difference between said slave clock and said master clock. The error signal can then be used to adjust the phase of the slave clock.

The apparatus may further include a filter which filters said error signal prior to forming a control signal, wherein the oscillator adjusts its frequency of oscillation based on said control signal. The filter may be adjusted so as to provide the appropriate level of gain such that the control signal causes the oscillator to adjust its frequency appropriately. This can allow the frequency to be adjusted so that it does not over-correct.

Preferably said detector is a phase detector which detects the phase difference between said slave clock and said master clock.

Preferably said master clock is synchronized with a recognized standard time source such as UTC or GPS.

In a particularly preferred embodiment, the messages are messages according to the IEEE 1588 Precision Time Protocol. In particular, in the "one step clock" approach, the messages may be Sync messages according to the IEEE 1588 Precision Time Protocol. IEEE 1588 PTP is rapidly gaining traction as the technology of choice to deliver synchronization to remote telecom elements over Ethernet (IEEE 802.3) and other packet-based backhaul connections.

Alternatively, in the "two step clock" approach, said first message and said further message are Sync messages according to the IEEE 1588 Precision Time Protocol and said second message and said follow up message are Follow_Up messages according to the IEEE 1588 Precision Time Protocol. The Follow_Up messages contain, as part of the message, the time-stamp for the time of sending of the Sync message which they follow.

In a particularly preferred embodiment, the oscillator, the pulse counter and the detector form a phase-locked loop.

Different forms of oscillator may be used in embodiments of the invention. Preferably the oscillator is able to adjust its frequency of oscillation based on an input signal, which, in this aspect is the error signal or the control signal. In one particular arrangement, the oscillator is a voltage-controlled oscillator.

In a preferred arrangement the oscillator is a numerically controlled frequency synthesizer or a direct digital synthesizer (DDS).

Because operations within a DDS device are primarily digital, it can offer fast switching between output frequencies, fine frequency resolution, and operation over a broad spectrum of frequencies. With advances in design and process technology, today's DDS devices are very compact and draw little power.

Preferably the numerically controlled frequency synthesizer includes: a reference clock; a phase accumulator which increments a phase counter based on the output of said reference clock and said error signal; and a phase-to-amplitude conversion device for converting the value stored in said phase counter to an oscillating output.

In a particular embodiment, the phase-to-amplitude conversion device is a sine-look up table stored in a memory device such as a read-only memory (ROM) or random access memory (RAM).

The numerically controlled frequency synthesizer is preferably set up such that its frequency output depends on two variables, a reference-clock frequency and the control signal or error signal.

Preferably the numerically controlled frequency synthesizer further includes a digital-to-analog converter for converting said oscillating output to an analog oscillating output.

Preferably the numerically controlled frequency synthesizer further includes a low-pass filter for smoothing said oscillating output.

The digital-to-analog converter and/or low pass filter can result in a more pure sinusoidal output from the numerically controlled frequency synthesiser.

Preferably the numerically controlled frequency synthesizer forms the oscillator within a digital phase-locked loop (DPLL) along with the pulse counter and the detector.

The DPLL is preferably arranged to control the oscillator output frequency such that the error signal produced by the detector goes to zero at the point at which the frequency of the slave clock equals the frequency of the master clock.

Embodiments of this second aspect may include some, all or none of the above described optional or preferred features.

Further aspects of the present invention provide a digital phase-locked loop based on a numerically controlled frequency synthesis technique and control models and algorithms therefor. The digital phase-locked loop may be a phase-locked loop as described in relation to the above second aspect in which the oscillator is a digital frequency synthesizer.

Figure 9:
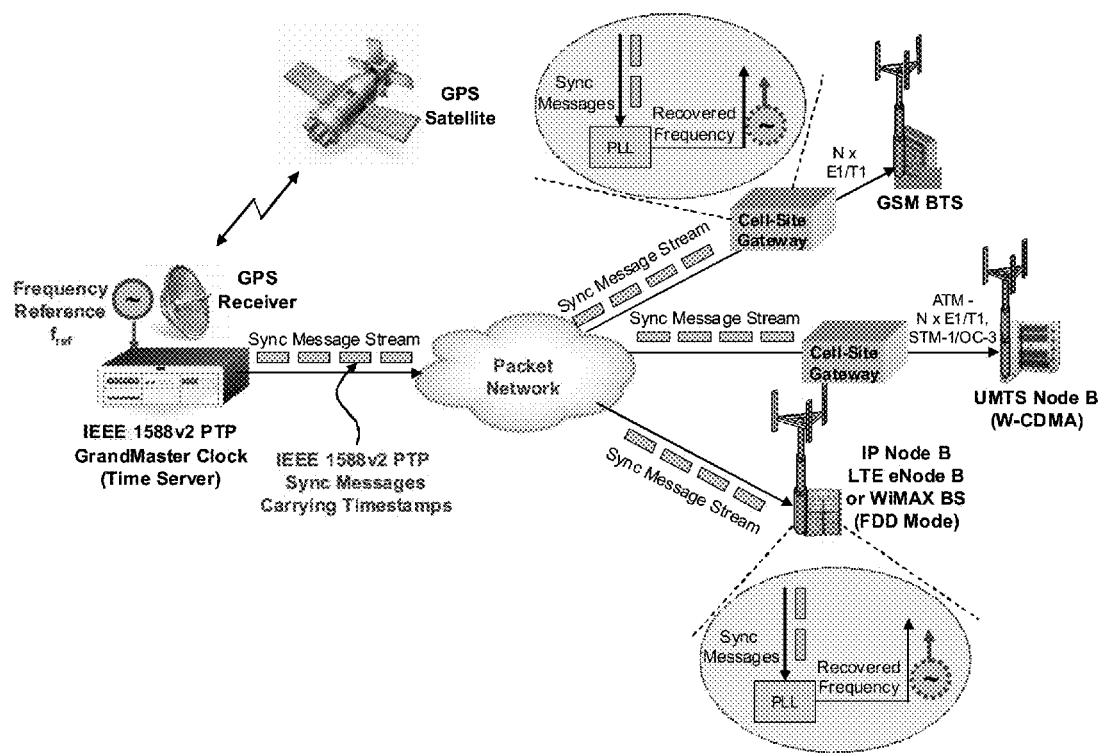
FIG. 9 shows an overview of a network system according to an embodiment of the present invention.

In the case of base station frequency synchronization, in embodiments of the present invention a grandmaster clock (possibly in a Central Office) sends only Sync and Follow_Up messages to the slaves as shown in FIG. 9. The grandmaster periodically broadcasts the current time to the other slaves. In IEEE 1588-2002 broadcasts can be configured up to once per second (1 Hz) while in IEEE 1588-2008, they can be configured up to 10 per second (10 Hz).

Figure 10:
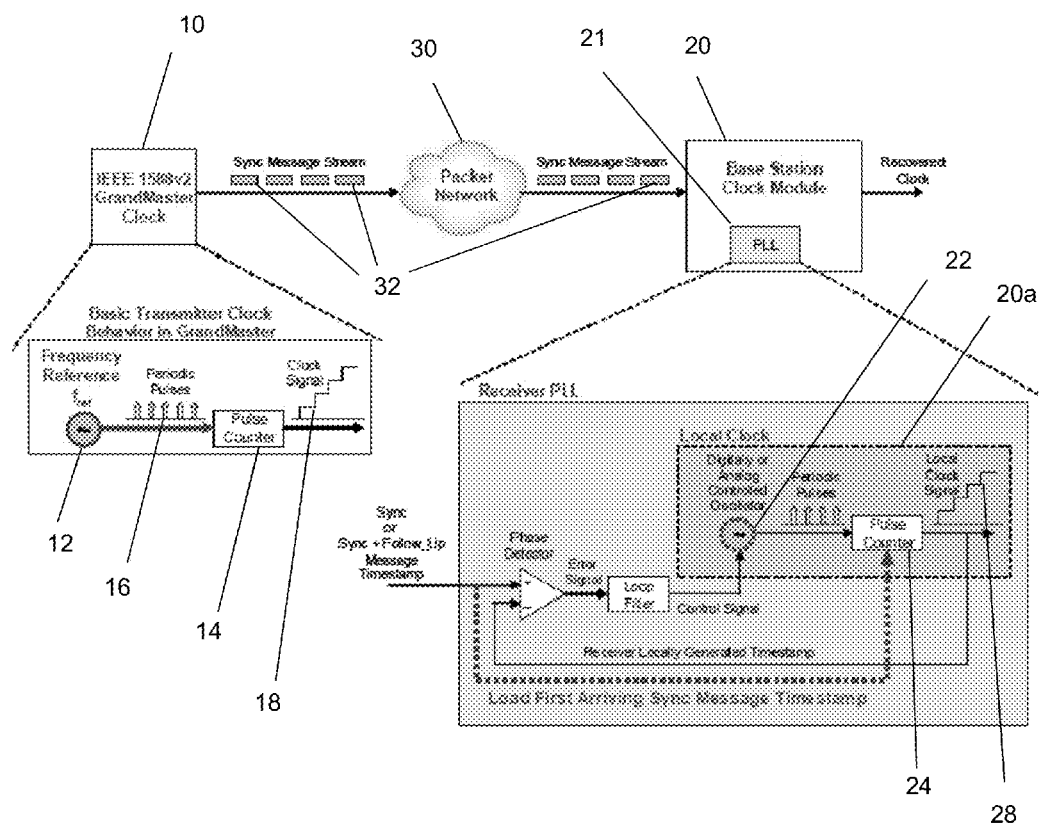
FIG. 10 shows an overview of a transmitter and a receiver in a system according to a first embodiment of the present invention.

FIG. 10 shows an overview of a transmitter and a receiver in a system according to a first embodiment of the present invention.

In general terms, the transmitter (master) clock 10 consists of an oscillator 12 and a pulse counter 14. The oscillator 12 issues periodic pulses 16 that make up the input to the pulse counter 14. The oscillator frequency is the inverse of the interval between consecutive pulses (oscillator period). The output of the counter 14 represents the master clock signal 18 and is incremented by a fixed amount at each pulse. Samples of master clock signals are communicated to a receiver (slave) as timestamps. The local clock 10 in the master may be free running but is typically synchronized to an external source of time which is traceable to TAI and UTC such as the Global Positioning System (GPS) or to an atomic clock.

From the flow of timestamp messages arriving at the clock module 20 of the receiver, the receiver phase-locked loop (PLL) 21 tunes its internal controlled oscillator 22 such that it produces an output clock signal 28 that is identical to the transmitter clock. To do this, the first arriving timestamp at the receiver is used to initialize the pulse counter 24 and PLL control is exercised such that the pulse counter readings coincide with arriving timestamp values. The timestamps used in determining the arrival instants of timestamp messages are based on timestamps generated from the local clock 20a. The control loop in the receiver PLL 21 adjusts the clock to agree with the time of its master, that is, to make the rate of the local clock equal to that of the master, i.e., syntonize the local clock to the master.

In the frequency synchronization technique according to an embodiment of this invention, each broadcast begins at time T1 with a Sync message 32 sent by the master to all the slave clocks 20 in the domain over the packet network 30 (for simplicity, FIG. 10 shows only a single slave clock, but it will be appreciated that multiple such clocks can be connected to a single master). A slave clock receiving this message takes note of the local time T2 when this message is received. The master may subsequently send a multicast Follow_Up message containing an accurate T1 timestamp, the reason being not all masters have ability to present an accurate time stamp in the Sync message and therefore it is only after the transmission is complete that they are able to retrieve an accurate time stamp for the Sync transmission from their network hardware. Masters with this limitation use the Follow_Up message to convey T1 and are referred to as two-step clocks. Masters with PTP capabilities built into their network hardware are able to present an accurate time stamp in the Sync message and do not need to send Follow_Up messages; these are called one-step clocks.

Figure 11:
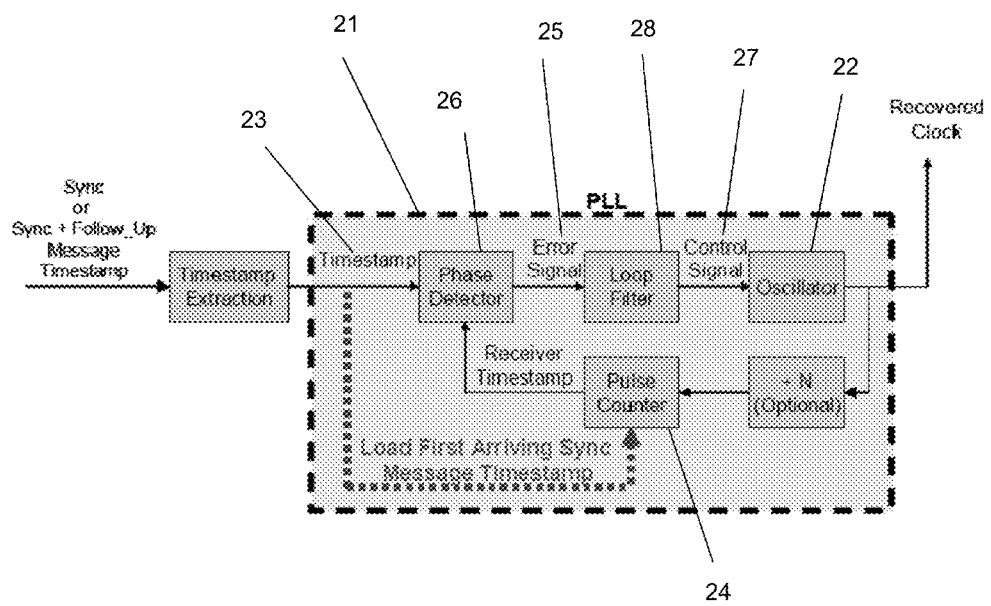
FIG. 11 shows an overview of the architecture of a phase-locked loop in the slave clock of an embodiment of the present invention.

FIG. 11 shows an overview of the architecture of the PLL 21 in the local/slave clock 20. The controlled oscillator 22 within the PLL produces a periodic pulse signal which drives a local pulse counter 24 whose output enters the phase detector 26. Here the phase of the signals from the pulse counter 24 and the incoming reference signal in the form of timestamps 23 are compared and a resulting difference or error signal 25 is produced. This error corresponds to the phase difference between the two signals, transmitter and receiver clocks.

The error signal 25 from the phase detector 26 in the PLL 21 passes through a low pass filter (loop filter 28) which governs many of the properties of the loop and removes any high frequency elements on the signal. Once through the filter 28 the error signal is applied to the control terminal of the controlled oscillator 22 as its control or tuning signal 27 (which is a voltage in the case of a voltage controlled oscillator (VCO)). The nature of this control signal is such that it tries to reduce the phase difference and hence the frequency between the two signals. Initially the loop will be out of lock, and the filtered error signal 27 will pull the frequency of the controlled oscillator 22 towards that of the reference, until it cannot reduce the error any further and the loop is locked. Details of preferred PLL algorithms used in the one-step and two-step clocks are set out in the relevant sections below. This synchronization strategy allows multiple slaves, for example in a broadcast or point-to-multipoint communication scenario, to synchronize their clocks to the master.

Figure 12:
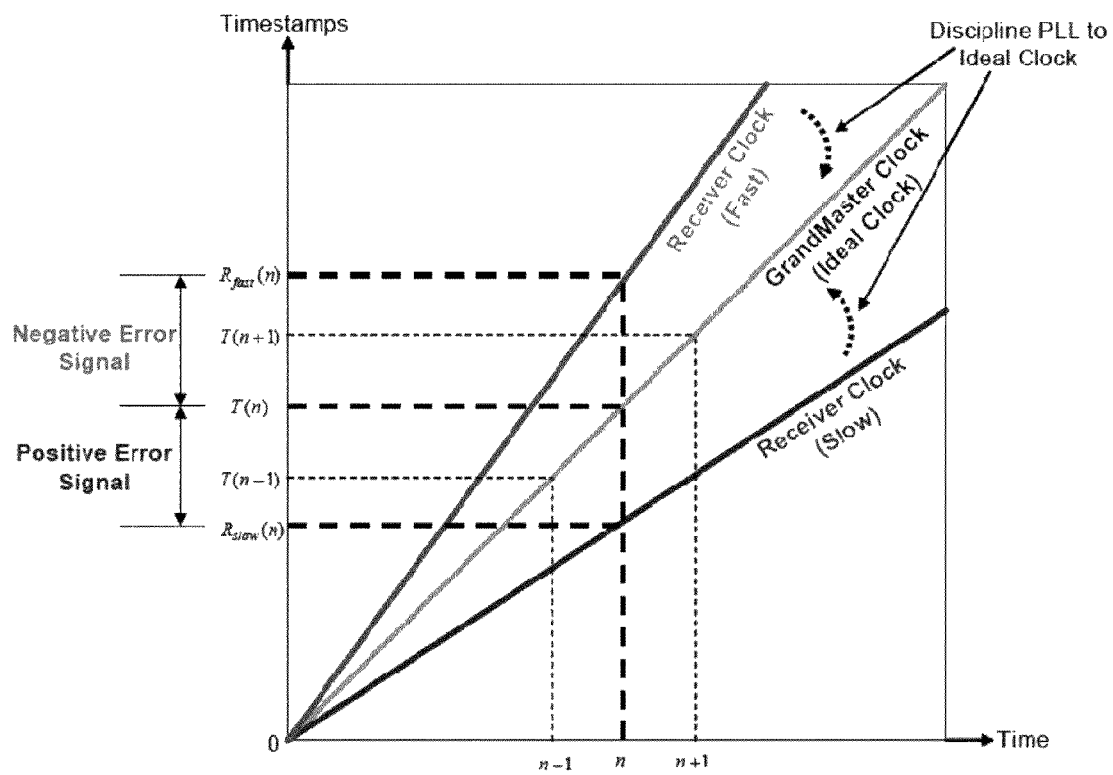
FIG. 12 shows the principles of frequency synchronisation according to an embodiment of the present invention.

Let T(n) denote the time base (e.g., in clock ticks) of the transmitter and R(n) the time base of the receiver. These two functions correspond to the timestamps of the two clocks at discrete time instants n, n □0,1,2,K. As illustrated in FIG. 12, only when the phase between the two signals (that is the difference between transmitter timestamp T(n) and receiver timestamp R(n)) is changing is there a frequency difference. The phase difference decreases to zero when the loop is in lock, which means that the frequency of the PLL internal controlled oscillator 22 is exactly the same as the reference frequency.

Preferred algorithms used by the slave PLL 21 to synchronize its frequency to that of the master clock 10 will now be descried. As described above, a Sync message 32 is transmitted by a master 10 to its slaves 20. It either contains the accurate time of its transmission (one-step clock) or is followed by a Follow_Up message containing this time (two-step clock).

One-Step Clock Algorithm

In order to estimate and mitigate oscillator drifts, the master clock 10 periodically sends a Sync message 32 based on its local reference clock to a slave clock 20 on the network. In the one-step clock mode, the master marks the exact time the Sync message is sent in the Sync when it departs. There is no need to send a Follow_Up message with the exact time information to the slave clock. The slave clock 20 timestamps the arrival of the Sync message using its local time base.

Figure 13:
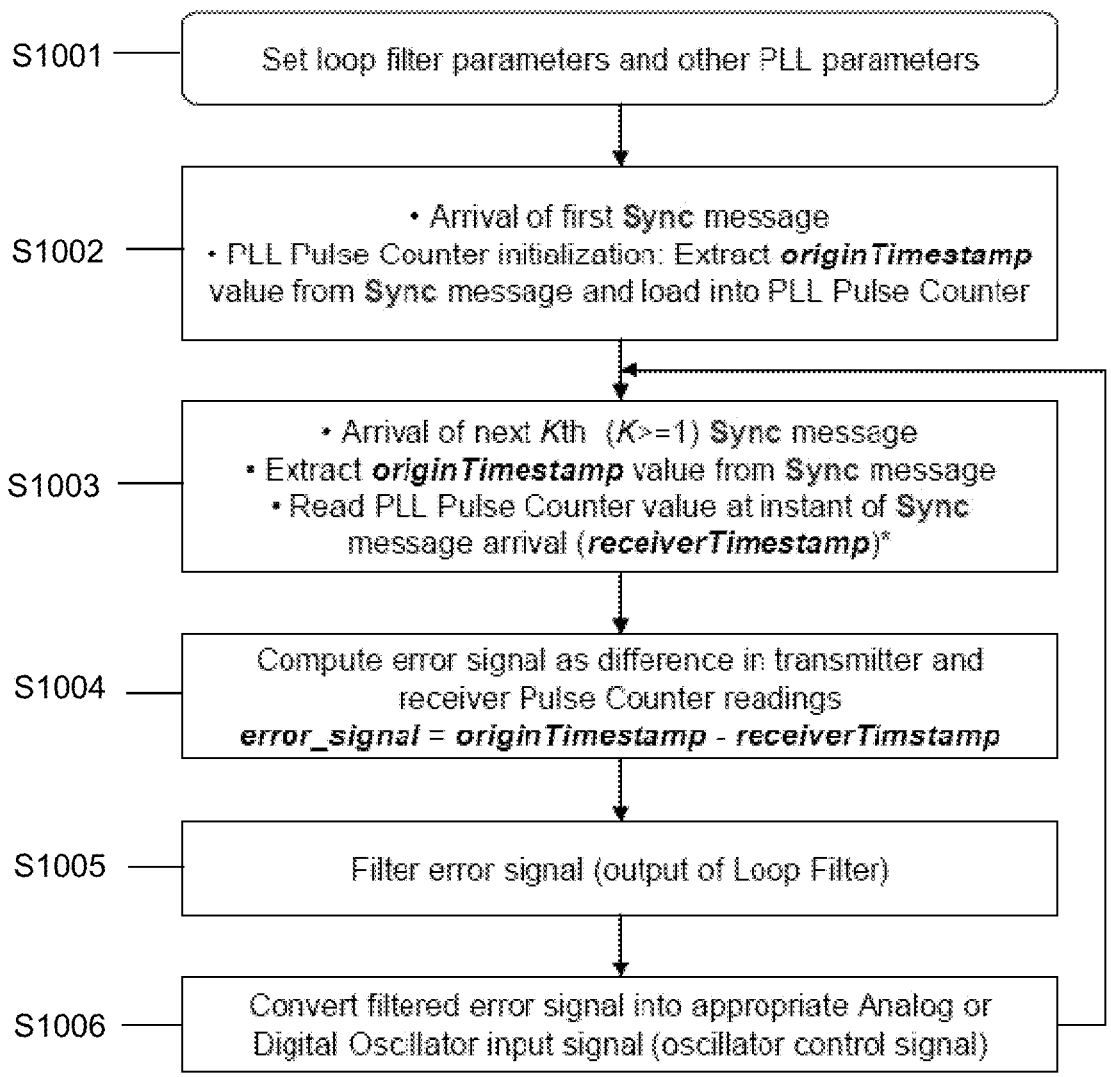
FIG. 13 shows the steps in the phase-locked loop in a one-step clock method according to an embodiment of the present invention.
Figure 14:
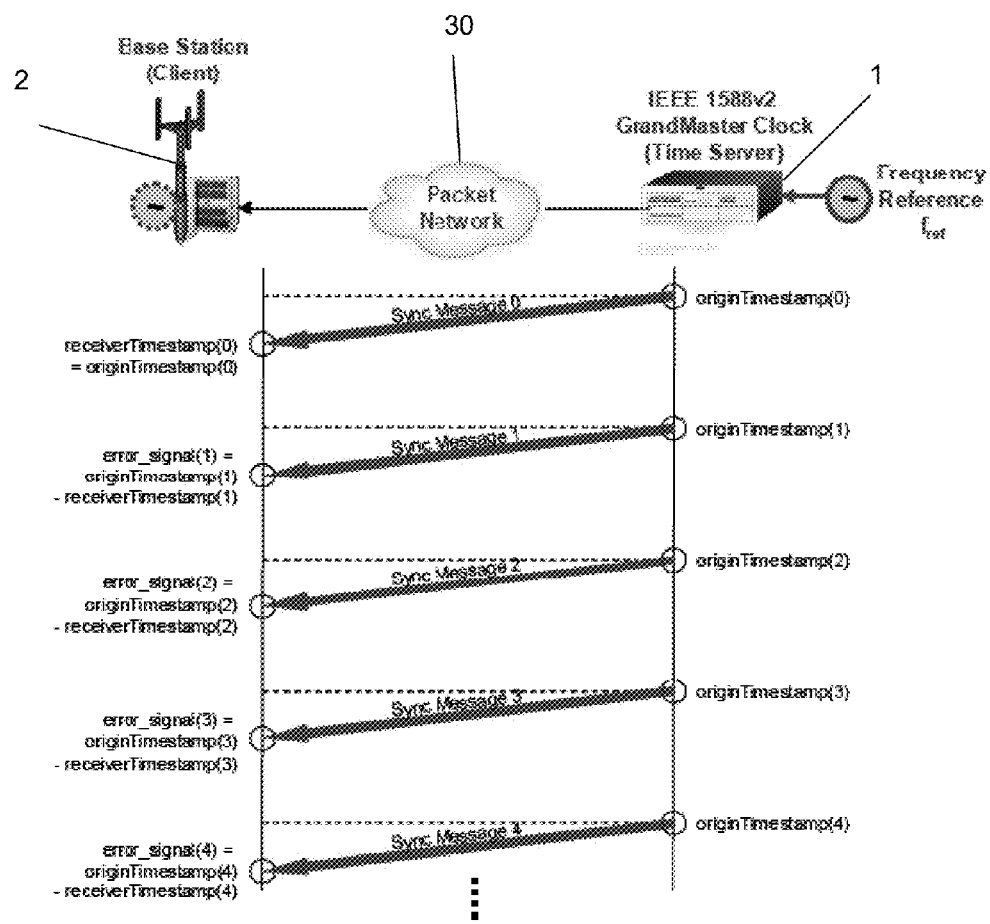
FIG. 14 shows schematically the processing steps in the one-step clock method as shown in FIG. 13.

FIG. 13 shows the steps in the PLL algorithm in the slave clock 20 for a one-step clock according to an embodiment of the present invention. FIG. 14 illustrates these steps schematically.

After initial set up (step S1001) at startup, the receiver PLL 21 waits for the first Sync message 32 to arrive. When the first Sync timestamp (originTimestamp(0)) arrives it is loaded into the PLL pulse counter 24 (step S1002). For a one-step clock, only the Sync timestamp (originTimestamp) is used to initialize the slave PLL pulse counter 24 since the originTimestamp field of the Sync message carries an accurate timestamp of the departure time of the Sync message from the master 1. No Follow_Up timestamps (preciseOriginTimestamp) are sent from the master in this case. From this point onwards and upon the receipt of subsequent Sync messages, the PLL starts to operate in a closed-loop fashion. If receiverTimestamp(0) denotes the PLL pulse counter value at initialization then we note that $$receiverTimestamp(0) = originTimestamp(0)$$

The slave 2 can be configured to pick every Kth arriving timestamp to be used in the PLL algorithm. Each time a Sync message arrives, its arrival instant (receiverTimestamp(K)) is noted by the slave using its local clock (step S1003). Then the difference between the Sync timestamp (originTimestamp (K)) and the timestamp measured by the slave PLL pulse counter (receiverTimestamp(K)) gives an error signal (step S1004)

$$error\_signal = originTimestamp(K) - receiverTimestamp(K)$$

This error signal 25 is sent to the loop filter 28 whose output (step S1005) controls the frequency of the analog or digital controlled oscillator 22 (step S1006). The output of the oscillator 22 in turn provides the clock frequency of the slave and also drives the pulse counter 24. After a while the error term is expected to converge to zero which means the slave PLL 21 has been locked to the incoming time base (master pulse counter evolution), i.e., time base and frequency of the master 1.

Two-Step Clock Algorithm

In the two-step clock operation, the master 1 marks the exact time the Sync message 32 is sent, and then a Follow_Up message with the exact time information is immediately sent to the slave clock 20. The slave clock 20 timestamps the arrival of the Sync message using its local time base.

Figure 15:
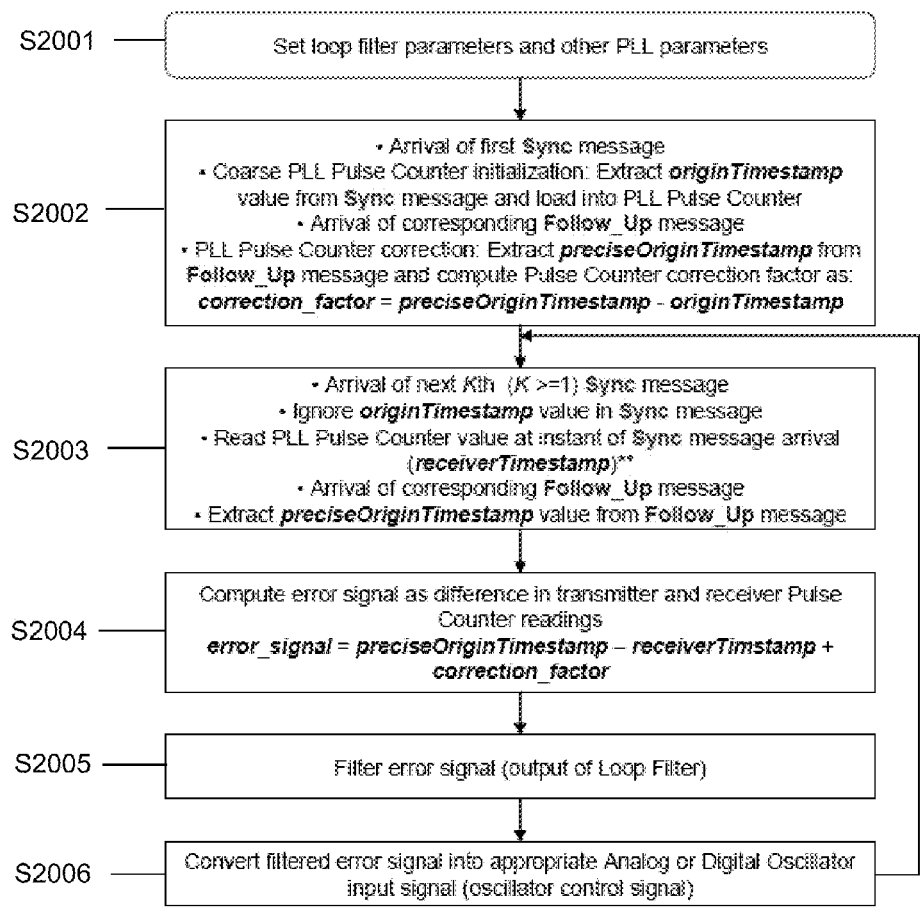
FIG. 15 shows the steps in the phase-locked loop in a two-step clock method according to an embodiment of the present invention.
Figure 16:
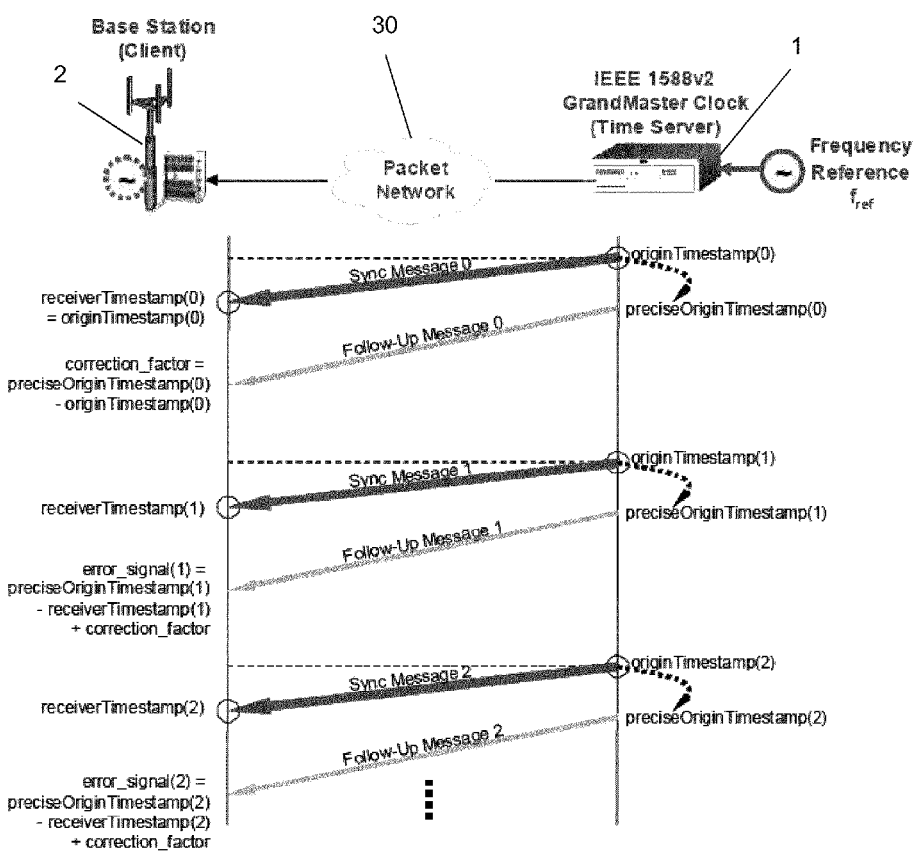
FIG. 16 shows schematically the processing steps in the two-step clock method as shown in FIG. 15.

FIG. 15 shows the steps in the PLL algorithm in the slave clock 20 for a one-step clock according to an embodiment of the present invention. FIG. 16 illustrates these steps schematically.

After initial set up (step S2001) at startup, the receiver PLL 21 waits for the first Sync message 32 to arrive. When the first Sync timestamp (originTimestamp(0)) arrives it is loaded into the PLL pulse counter 24 as a coarse initialization. If receiverTimestamp(0) is the PLL pulse counter value at coarse initialization then we note that receiverTimestamp(0)=originTimestamp(0)

Then when the corresponding Follow_Up timestamp (preciseOriginTimestamp(0)) arrives, a correction factor is computed to correct for the coarse initialization of the PLL pulse counter 24. This correction factor (correction_factor) forms an initialization offset which is the difference between first arriving Follow_Up timestamp (preciseOriginTimestamp(0)) and first arriving Sync timestamp (originTimestamp(0)).

correction_factor=preciseOriginTimestamp(0)−originTimestamp(0)

This initial value receiverTimestamp(0)=originTimestamp(0) has to be corrected with the correction factor so that it reflects preciseOriginTimestamp(0) (step S2002).

Upon the arrival of subsequent Sync and Follow_Up messages, the slave PLL 21 starts to operate in a closed-loop fashion. Each time a Sync timestamp arrives, its arrival instant (receiverTimestamp(K)) is captured by the slave 2 using its local clock but its timestamp (originTimestamp(K)) is ignored by the slave. When the corresponding Follow_Up message arrives, its timestamp (preciseOriginTimestamp(K)) is extracted by the slave 2 (step S2003).

Then the slave computes the error signal as follows (step S2004):

error_signal=preciseOriginTimestamp(K)−receiverTimestamp(K)+correction_factor

This error signal is sent to the loop filter 28 (step S2005) whose output is used to control the frequency of the analog or digital controlled oscillator 22 (step S2006).

Packet Based Digital Phase Locked Loop (DPLL)

Figure 17:
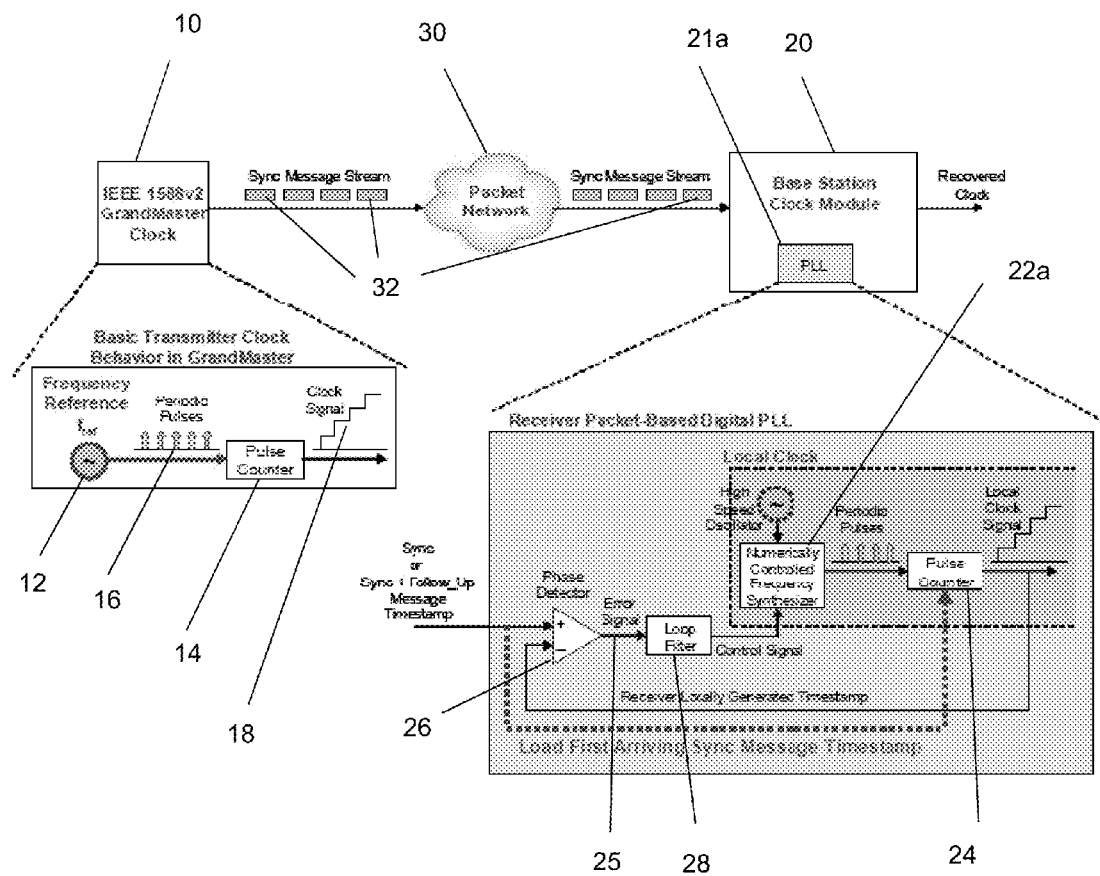
FIG. 17 shows an overview of a transmitter and a receiver in a system according to a second embodiment of the present invention.
Figure 18:
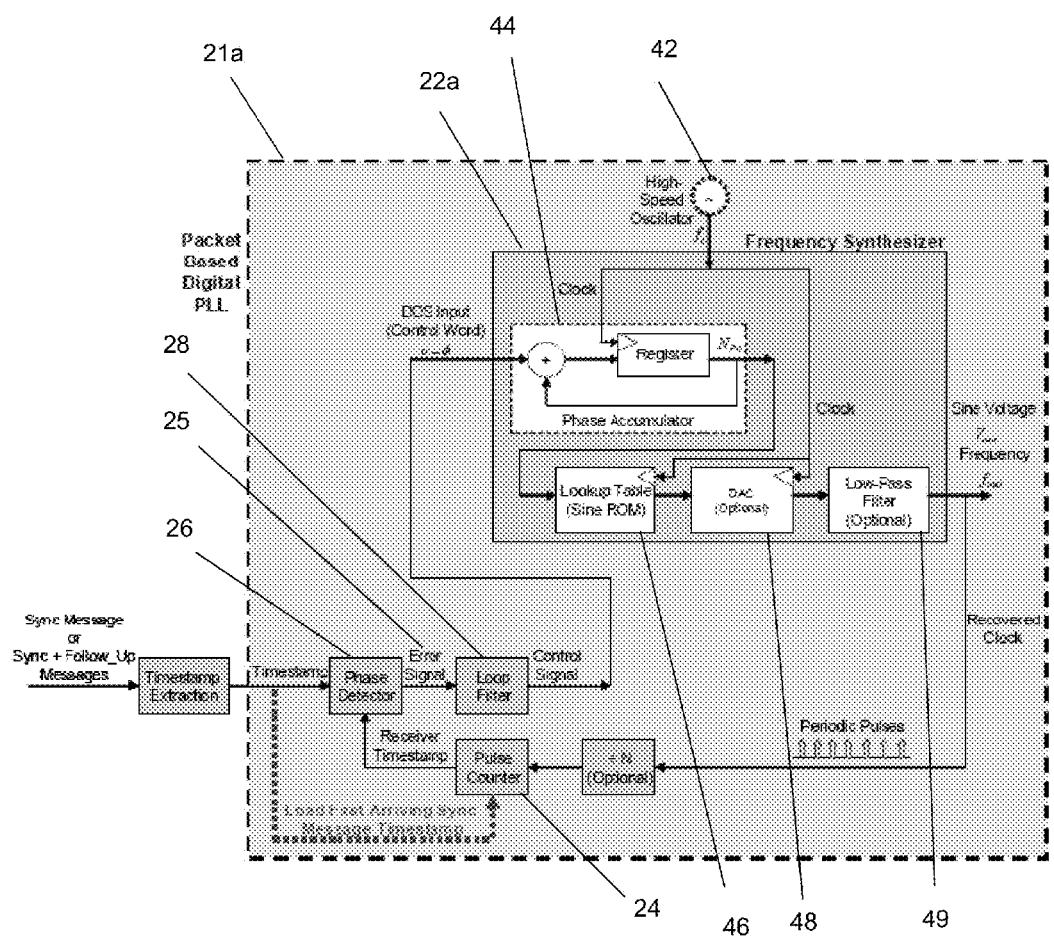
FIG. 18 shows an overview of the architecture of a phase-locked loop in the slave clock of FIG. 17.

In one embodiment of the present invention, the receiver PLL 21 is a digital PLL. FIG. 17 shows the packet-based frequency synchronization architecture with the receiver PLL implemented as a digital PLL (DPLL) 21a. FIG. 18 shows the internal architecture of the DPLL 21a of FIG. 17.

The function of the DPLL 21a is to control the receiver clock frequency $f_{out}$ such that the error signal 25 produced by the phase detector 26 goes to zero at which point the receiver frequency equals the transmitter frequency, $f_{out} \Box f_{ref}$. In addition to the phase detector 26, loop filter 28, and pulse counter 24, the DPLL has a numerically controlled frequency synthesizer 22a. The frequency synthesizer 22a (which can also be referred to as a direct digital synthesizer (DDS)) is based on direct digital synthesis. The packet-based DPLL with the frequency synthesizer or DDS 22a is shown in FIG. 18.

The ability to accurately produce and control waveforms of various frequencies and profiles has become a key requirement common to a number of industries. The DDS technique is rapidly gaining acceptance for solving frequency- (or waveform-) generation requirements in both communications and industrial applications because single-chip IC devices can generate programmable output waveforms simply and with high resolution and accuracy.

DDS devices are now available that can generate frequencies from less than 1 Hz up to 400 MHz (using, for example, a 1-GHz clock). The benefits of their low power, low cost, and single small package, combined with their inherent excellent performance and the ability to digitally program (and reprogram) the output waveform, make DDS devices an extremely attractive solution for frequency generation.

Figure 19:
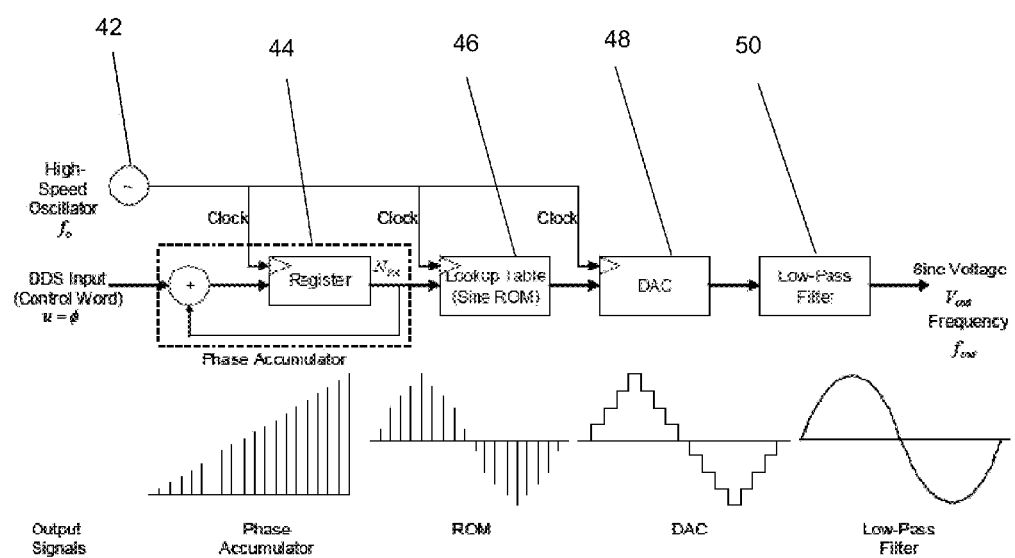
FIG. 19 shows the signal flow through the direct digital synthesizer of FIG. 18.

The main components of the DDS 22a are a precision high-frequency reference clock 42, a phase accumulator 44, a means of phase-to-amplitude conversion 46 (which, for example, may be a sine look-up table implemented in a programmable read only memory (PROM)), and a digital-to-analog converter (DAC) 48. FIG. 19 shows the operation of the DDS 22a in more detail. The DAC 48 and low-pass filters 49 are optional components. The integration of a DAC and filter into a DDS single chip is commonly known as a complete DDS solution.

The DDS 22a can produce, for example, a sine wave at a given frequency (although DDS devices are not limited to purely sinusoidal outputs). The frequency depends on two variables, the reference-clock frequency ($f_0$) and the binary number ($\Box$) (also called the tuning word or control word) programmed into the frequency register.

Figure 20:
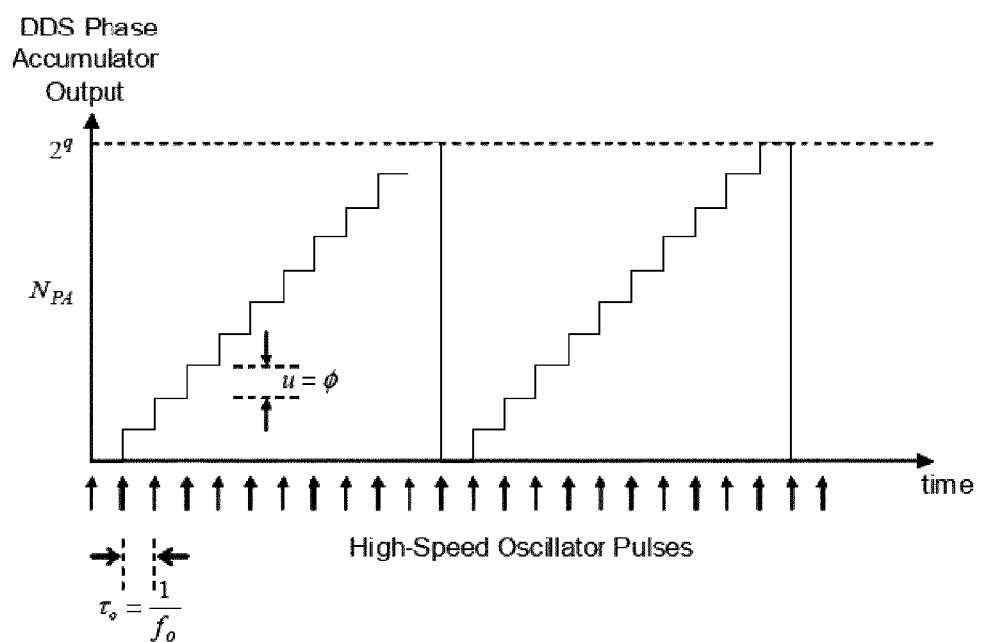
FIG. 20 shows the make up of the phase accumulator output of the direct digital synthesizer of FIG. 18.

As shown in FIG. 19, the binary number $\Box$ in the frequency register provides the main input to the phase accumulator. If a sine look-up table 46 is used, the phase accumulator 44 computes a phase (angle) address for the look-up table, which outputs the digital value of amplitude, corresponding to the sine of that phase angle, to the DAC 48. The DAC 48, in turn, converts that number to a corresponding value of analog voltage or current which can then be low-pass filtered by low-pass filter 49. To generate a fixed-frequency sine wave, a constant value (the phase increment, which is determined by the binary number) is added to the phase accumulator with each clock cycle, as shown in FIG. 20. If the phase increment is large, the phase accumulator 44 will step quickly through the sine look-up table and thus generate a high frequency sine wave. If the phase increment is small, the phase accumulator will take many more steps, accordingly generating a slower waveform.

The operation of the phase accumulator 44 will now be described. Continuous-time sinusoidal signals have a repetitive angular phase range of 0 to $2\pi$ as shown in FIG. 21. The digital implementation is no different. The counter's carry function allows the phase accumulator to act as a phase wheel in the DDS implementation.

Figure 22:
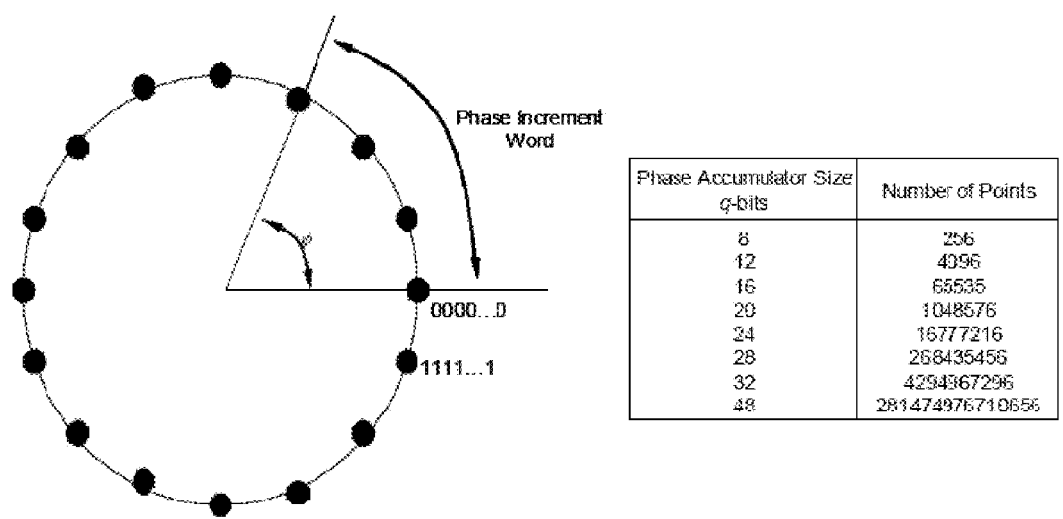
FIG. 22 shows a digital phase wheel.

To understand this basic function, the sine-wave oscillation can be visualized as a vector rotating around a phase circle as shown in FIG. 22. Each designated point on the phase wheel corresponds to the equivalent point on a cycle of a sine wave. As the vector rotates around the wheel, the sine of the angle generates a corresponding output sine wave. One revolution of the vector around the phase wheel, at a constant speed, results in one complete cycle of the output sine wave. The phase accumulator 44 provides the equally spaced angular values accompanying the vector's linear rotation around the phase wheel. The contents of the phase accumulator 44 correspond to the points on the cycle of the output sine wave.

The phase accumulator 44 is actually a modulo-$\Box$ counter that increments its stored number each time it receives a clock pulse. The magnitude of the increment is determined by the binary-coded input word ($\Box$). This word forms the phase step size between reference clock updates; it effectively sets how many points to skip around the phase wheel. The larger the jump size, the faster the phase accumulator 44 overflows and completes its equivalent of a sine-wave cycle. The number of discrete phase points contained in the wheel is determined by the resolution of the phase accumulator (q), which determines the tuning resolution of the DDS. For a q=28-bit phase accumulator, a $\Box$ value of 0000 . . . 0001 would result in the phase accumulator overflowing after $2^{28}$ reference-clock cycles (increments). If the $\Box$ value is changed to 0111 . . . 1111, the phase accumulator will overflow after only 2 reference-clock cycles (the minimum required by Nyquist). This relationship is found in the basic tuning equation for DDS architecture:

$$f_{out} = \frac{\phi \cdot f_0}{2^q}$$

where:
 $f_{out}$=output frequency of the DDS
 φ=binary tuning word
 $f_0$=internal reference clock frequency (system clock)
 q=length of the phase accumulator, in bits Changes to the value of φ result in immediate and phase-continuous changes in the output frequency. No loop settling time is incurred as in the case of a phase-locked loop.

As the output frequency is increased, the number of samples per cycle decreases. Since sampling theory dictates that at least two samples per cycle are required to reconstruct the output waveform, the maximum fundamental output frequency of a DDS is $f_0/2$.

However, for practical applications, the output frequency is limited to somewhat less than that, improving the quality of the reconstructed waveform and permitting filtering on the output. When generating a constant frequency, the output of the phase accumulator increases linearly, so the waveform it generates is inherently a ramp.

A phase-to-amplitude lookup table 46 is used to convert the phase-accumulator's instantaneous output value (e.g. 28 bits with unneeded less-significant bits eliminated by truncation) into the sine-wave amplitude information that is presented to the DAC converter (which may have, for example, a 10-bit input). The DDS architecture exploits the symmetrical nature of a sine wave and utilizes mapping logic to synthesize a complete sine wave from one-quarter-cycle of data from the phase accumulator. The phase-to-amplitude lookup table 46 generates the remaining data by reading forward then back through the lookup table.

Because operations within a DDS device are primarily digital, it can offer fast switching between output frequencies, fine frequency resolution, and operation over a broad spectrum of frequencies. With advances in design and process technology, today's DDS devices are very compact and draw little power.

The phase accumulator is a variable-modulus counter that increments the number stored in it each time it receives a clock pulse. When the counter overflows it wraps around, making the phase accumulator's output contiguous. The larger the added increment φ, the faster the accumulator overflows, which results in a higher output frequency.

The output frequency $f_{out}$ of the DDS waveform is a function of the system clock frequency $f_0$, the number of bits q in the phase accumulator and the phase increment value φ. The phase increment value required to generate an output frequency $f_{out}$ Hz is $$\phi = \frac{2^q f_{out}}{f_0} \quad (1)$$

The phase increment φ is an unsigned value. The phase increment term defines the DDS output frequency.

For example, the DDS may operate with a control input $\phi_{nom}$ which corresponds to the nominal frequency $f_{out}=f_{nom}$. We see from the above discussion that, adding a quantity $-\Delta\phi$ to $\phi_{nom}$ (i.e., $\phi_{DDS}=\phi_{nom}-\Delta\phi$) results in a decrease in the output frequency, $f_{out}=f_{nom}-\Delta f$, whereas adding a quantity $\Delta\phi$ to $\phi_{nom}$ (i.e., $\phi_{DDS}=\phi_{nom}+\Delta\phi$) results in an increase in the output frequency, $f_{out}=f_{nom}+\Delta f$. Thus, by appropriately controlling the quantity $\Delta\phi$ added to $\phi_{nom}$, the output frequency of the DDS $f_{out}$ can be controlled accordingly. The size of the phase increment determines the actual output frequency and the fixed binary width q of the accumulator (which overflows) determines the minimum frequency resolution of the DDS.

Control of the DPLL

A PLL is essentially a feedback control system, so we need mathematical models of the PLL components in order to determine the parameters of the loop filter. Due to the discrete nature of the DPLL 22a, its operations are described by linear difference equations.

The z-transform technique is employed to analyze the general tracking (i.e. steady-state) behavior of the DPLL 22a. Under the steady-state assumption, the phase error samples are small and the general non-linear difference equation can be approximated by a linear one which can be solved by the z-transform technique. R. E. Best, *Phase-Locked Loops. Design, Simulation, and Applications*, McGraw-Hill, New York, Fourth Edition, 1999 notes that when the DPLL has acquired lock and is not pulled out by large phase steps, frequency steps, or phase noise applied to its reference input, its performance can be analyzed by a linear model.

In the DDS 22a, the nominal control word $\phi_{nom}$ produces the corresponding nominal frequency $f_{nom}$. Let us assume that the control input $\phi_{nom}$ is changed by the amount $\Delta\phi$ at a discrete time n. Note that the change takes effect in the next discrete interval. This change results in an output frequency of $$f_{out}(n) = \frac{f_0}{2^q}(\phi_{nom} + \Delta\phi(n-1)) = f_{nom} + \Delta f(n), \text{ or} \quad (2)$$

$$f_{out}(n) = f_{nom} + \frac{f_0}{2^q}\Delta\phi(n-1). \quad (3)$$

This corresponds to an angular frequency of $$\omega_{out}(n) = \omega_{nom} + \frac{2\pi f_0}{2^q}\Delta\phi(n-1). \quad (4)$$

The above equation can also be written as $$\omega_{out}(n)=\omega_{nom}+K_{DDS}\Delta\phi(n-1)=\omega_{nom}+\Delta\omega(n) \quad (5)$$

where $$K_{DO} = K_{DDS} = \frac{2\pi f_0}{2^q} \quad (6)$$

is the digital oscillator (DDS) gain. By definition, the phase of the DDS $\phi_{out}$ is given by the integral over the frequency variation $\Delta\omega(n)$ $\omega_{out}(n)-\omega_{nom}$ as $$\theta_{out}(n) = \sum_{i=0}^{n}\Delta\omega(i) = K_{DDS}\sum_{i=0}^{n}\Delta\phi(i) \quad (7)$$

The DDS appears in the digital PLL as a digital integrator, just as a VCO appears as an analog integrator in the analog PLL.

Given that $\theta_{out} = 2\pi f_0 \Delta/2^q$, the DDS gain can be obtained alternatively as $K_{DDS} = d\theta_{out}/d\Delta = 2\pi f_0/2^q$.

From the above integration, the transfer function of the digital oscillator (DDS) in the z-domain is given as $$G_{DO} = G_{DDS}(z) = \frac{\Theta_{out}(z)}{\Phi(z)} = K_{DDS} \cdot \frac{z^{-1}}{1 - z^{-1}} = 2^{1-q}\pi f_0 \cdot \frac{z^{-1}}{1 - z^{-1}} \quad (8)$$

where $z^{-1}$ denotes the delay operator (i.e., $z^{-1}x(n) = x(n-1)$), and $\Phi_{DDS}(z)$ and $\Phi(z)$ are the z-transforms of $\theta_{out}(n)$ and $\phi(n)$, respectively.

Figure 23:
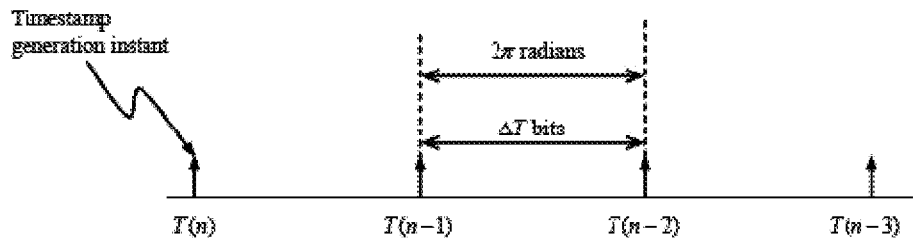
FIG. 23 shows a phase detector signal in bits and radians.

It is assumed that the timestamp generation period is constant, that is, $\Delta T(n) = \Delta T$ and that there is no jitter in the system. The phase detector (PD) 26 determines a phase error approximately every $\Delta T(n)$ (bit) interval. In this case, measurements and control are done every $\Delta T$ interval, thus, $\Delta T$ tick is equivalent to $2\pi$ radians as shown in FIG. 23. It is noted that in a PLL, if measurements and control are done on a bit-by-bit basis, an error of 1 clock tick is equivalent to $2\pi$ radians. This is also analogous to the case of observing an error of 1 bit off a threshold in an elastic-buffer type PLL where errors are measured in bits or fractions of a bit around a buffer threshold.

Therefore, given an error $e(n)$ in bits and a phase error $\theta_e(n)$ in radians, the following bit error-phase error relationship arises $$\frac{e(n)}{\Delta T} = \frac{\theta_e(n)}{2\pi} \text{ or} \quad (9)$$

$$e(n) = \frac{\Delta T}{2\pi} \cdot \theta_e(n)$$

With this, the PD gain can be written as $$K_{PD} = \frac{\Delta T}{2\pi} \quad (10)$$

Figure 24:
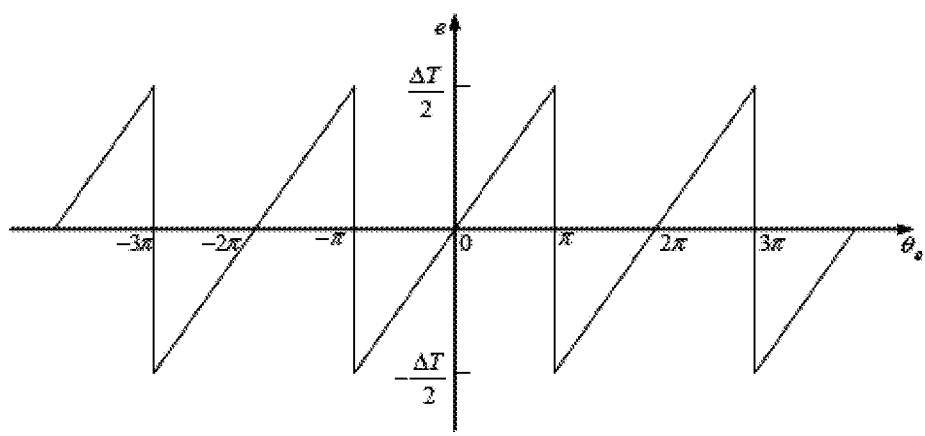
FIG. 24 shows characteristics of a phase detector.

The PD characteristic curve is set out in FIG. 24. The PD gain is equal to the slope of its characteristic curve.

The PD 26 measures the phase difference $\theta_e(n) = \theta_{ref}(n) - \theta_{out}(n)$ between the DDS clock phase $\theta_{out}(n)$ and the reference clock phase $\theta_{ref}(n)$ and develops an output $e(n)$ that is proportional to this phase-frequency difference $\theta_e(n)$. The ranges of $\theta_e(n)$ are $-\pi \leq \theta_e(n) \leq \pi$. This operation can be expressed as $$e(n) = K_{PD} \theta_e(n) \quad (11)$$

The error signal output $e(n)$ is then passed to the loop filter $G_{LF}(z)$ to be processed into the filtered error $\tilde{e}(n)$. The transfer function of the PD is given as $$G_{PD}(z) = \frac{E(z)}{\Theta_e(z)} = K_{PD} = \frac{\Delta T}{2\pi} \quad (12)$$

where $E(z)$ and $\Theta_e(z)$ are the z-transforms of $e(z)$ and $\theta_e(z)$, respectively.

The error signal $e(n)$ from the PD 26 is passed to a digital loop filter 28 whose output, $\tilde{e}(n)$, is used to adjust the frequency $f_{out}$ of the DDS 22a. There are many forms of filters that can be used as the loop filter as set out in R. E. Best, *Phase-Locked Loops. Design, Simulation, and Applications*, McGraw-Hill, New York, Fourth Edition, 1999. For example, the digital loop filter 28 could be implemented as a proportional plus integral (PI) filter having transfer function $G_{LF}(z)$ given by $$G_{LF}(z) = \frac{\tilde{E}(z)}{E(z)} = K_1 + \frac{K_2}{1 - z^{-1}} \quad (13)$$

where $K_1$ and $K_2$ are the proportional and integral path gains, respectively. $E(z)$ and $\tilde{E}(z)$ are the z-transforms of $e(n)$ and $\tilde{e}(n)$, respectively. The loop filter being a PI filter yields a second-order PLL.

The proportional gain $K_1$ and the integral gain $K_2$ determine the filter response. The filter gains $K_1$ and $K_2$ may be adjusted dynamically on the fly, with greater gain in the startup process for fast locking (acquisition mode) and smaller gain in steady-state for better steady-state error (tracking mode).

Control of the Overall DPLL and Loop Filter Design Parameters

Figure 25:
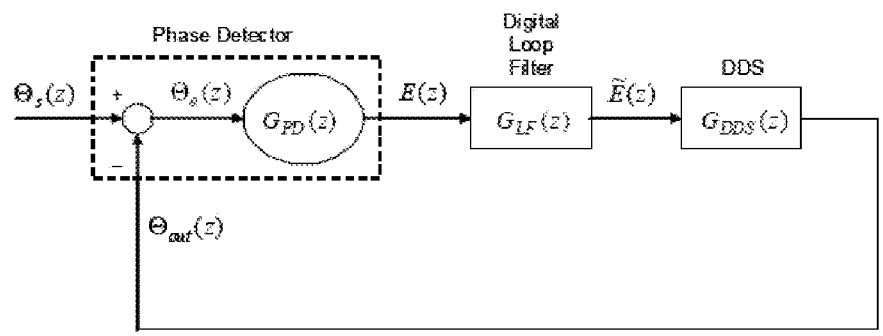
FIG. 25 is a schematic illustration of a closed-loop control model of a DPLL forming part of an embodiment of the present invention.
Figure 26:
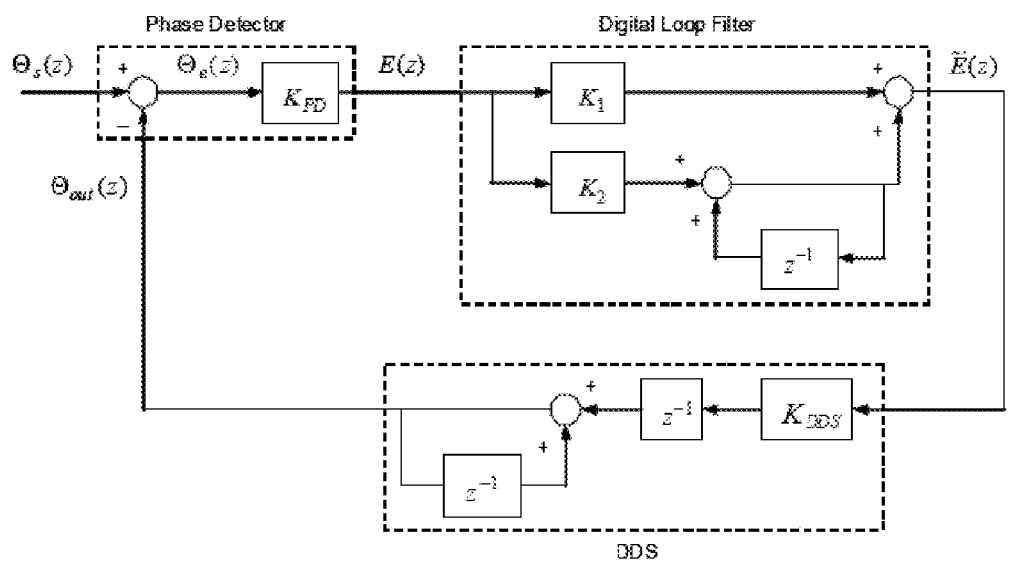
FIG. 26 shows further details of the DPLL of FIG. 25.

The DPLL 21a with a well-designed loop filter 28 can eventually eliminate the phase difference and make the controlled oscillator (i.e., DDS 22a) output phase and frequency lock to the reference. FIG. 25 and FIG. 26 show the DPLL 21a as a closed-loop feedback control system. The system is a second-order feedback system due to the first-order low-pass filter.

This section describes a method for synthesizing a digital PLL 21a according to an embodiment of the present invention using standard control theory principles assuming that the DPLL 21a is in the tracking (steady-state) mode with small phase error about the reference phase. The design is based on the digitization of a continuous-time system whereby the s-plane poles and zeros of a specified differential equation are mapped to the z-plane poles and zeros of a corresponding difference equation using the matched pole-zero (MPZ) method as described in G. F. Franklin, J. D. Powell and A. Emami-Naeini, *Feedback Control of Dynamic Systems*, Addison-Wesley Reading, Mass., 1994.

The typical analog or continuous-time PLL (referring to the relevant components in FIG. 11) consists of a phase detector 26, a loop filter 28 and voltage controlled oscillator (VCO) 22. The phase detector 26 can simply be represented by as a constant gain $K_{PD}$. The VCO 22 can be modeled as a perfect integrator in the Laplace domain as $G_{VCO}(s) = K_{VCO}/s$, where $K_{VCO}$ is its gain. The loop filter 28 can be specified in Laplace domain as $F(s)$.

In the absence of noise, the closed-loop transfer function and normalized phase error response are specified in the Laplace domain, respectively, as $$H(s) = \frac{\Theta_{VCO}(s)}{\Theta_{ref}(s)} = \frac{K_{PD}K_{VCO}F(s)}{s + K_{PD}K_{VCO}F(s)} \text{ and} \quad (14)$$

$$\frac{\Theta_e(s)}{\Theta_{ref}(s)} = \frac{\Theta_{ref}(s) - \Theta_{VCO}(s)}{\Theta_{ref}(s)} = \frac{s}{s + K_{PD}K_{VCO}F(s)} = 1 - H(s) \quad (15)$$

where $\Theta_{VCO}(s)$, $\Theta_{ref}(s)$, and $\Theta_e(s)$ are the Laplace transforms of the VCO phase $\theta_{VCO}(t)$, reference signal phase $\theta_{ref}(t)$, and phase error $\theta_e(t)$, respectively.

The order of the loop is equal to the number of perfect integrators within the loop structure as discussed in R. E. Best, *Phase-Locked Loops. Design, Simulation, and Applications*, McGraw-Hill, New York, Fourth Edition, 1999. Since the VCO 22 is modeled as a perfect integrator the loop is at least of order 1. If the loop filter contains one perfect integrator, then the loop is of order 2.

The order of the loop can be shown to greatly influence the steady-state performance of the loop. The steady-state phase error can readily be determined from equation (15) by means of the Final Value Theorem as set out in G. F. Franklin, J. D. Powell and A. Emami-Naeini, *Feedback Control of Dynamic Systems*, Addison-Wesley Reading, Mass., 1994, i.e., $$\lim_{t \to \infty} \theta_e(t) = \lim_{s \to 0} s \Theta_e(s) = \lim_{s \to 0} \frac{s^2 \Theta_{REF}(s)}{s + K_{PD} K_{VCO} F(s)} \quad (16)$$

The steady-state error is defined as the deviation of the VCO phase from the reference after the transient response has died out. The steady-state error is simply $\theta_e(\infty)$. It can be shown by means of equation (16) that a first-order loop or higher will track an initial phase offset with zero steady-state error. Moreover, a second-order system is required to track a frequency step, while a third-order loop must be employed to track an accelerating phase with zero steady-state error.

In an embodiment of the present invention, a second-order lag-lead filter (also known as a proportional-integral (PI) filter) is used which has transfer function $$F(s) = \frac{1 + s\tau_2}{s\tau_1} \quad (17)$$

where $\tau_1$ and $\tau_2$ are time constants of the filter. The filter has a pole at s=0 and therefore behaves like an integrator. It has (at least theoretically) infinite gain at zero frequency. The closed-loop transfer function of the PLL with this filter is obtained (as set out in R. E. Best, *Phase-Locked Loops. Design, Simulation, and Applications*, McGraw-Hill, New York, Fourth Edition, 1999) as $$H(s) = \frac{2\zeta\omega_n s + \omega_n^2}{s^2 + 2\zeta\omega_n s + \omega_n^2} = \frac{2\zeta\omega_n s + \omega_n^2}{(s - s_0)(s - s_1)} \quad (18)$$

where $\omega_n$ and $\zeta$ are the natural frequency and damping factors, respectively, and are specified in terms of $K_{PD}$, $K_{VCO}$, $\tau_1$ and $\tau_2$ as $$\omega_n = \sqrt{\frac{K_{PD} K_{VCO}}{\tau_1}} \quad (19)$$

$$\zeta = \frac{\omega_n \tau_2}{2} \quad (20)$$

These two parameters are usually used to specify performance requirements of a system. The poles of the closed loop system are $$s_{0,1} = -\zeta\omega_n \pm j\omega_n \sqrt{1 - \zeta^2} \quad (21)$$

When $\zeta < 1$, the poles are real; and when $\zeta < 1$, the poles are complex and conjugate. When $\zeta = 1$, the poles are repeated and real and the condition is called critical damping. When $\zeta < 1$, the response is underdamped and the poles are complex.

The transient response of the closed-loop system is increasingly oscillatory as the poles approach the imaginary axis when $\zeta$ approaches zero. The above model can be directly applied to the PLL in the continuous-time domain. However, for systems based on sampled data, discrete-time models have to be used.

A linearized, time-invariant, approximate transfer function for the entire DPLL 21a can be derived based on the condition that non-linearity of the system quantization is neglected.

The z-domain representation of the phase detector 26, loop filter 28 and the digital oscillator 22a (i.e., DDS) are given, respectively, as $$G_{PD}(z) = K_{PD} \quad (22)$$

$$G_{LF}(z) = K_1 + \frac{K_2}{1 - z^{-1}} = \frac{(K_1 + K_2)z - K_1}{z - 1} \quad (23)$$

$$G_{DO}(z) = \frac{K_{DO} z^{-1}}{1 - z^{-1}} = \frac{K_{DO}}{z - 1}, \quad K_{DO} = K_{DDS} \quad (24)$$

Using these transfer functions, the closed-loop transfer function of the DPLL 21a becomes $$H(z) = \frac{G_{PD}(z) G_{LF}(z) G_{DO}(z)}{1 + G_{PD}(z) G_{LF}(z) G_{DO}(z)} \quad (25)$$

$$H(z) = \frac{K_{PD} K_{DO} (K_1 + K_2) z - K_{PD} K_{DO} K_1}{z^2 + [K_{PD} K_{DO} (K_1 + K_2) - 2] z - (K_{PD} K_{DO} K_1 - 1)} \quad (26)$$

A matched pole-zero (MPZ) method can be applied to H(s) to obtain a discrete-time system $H_2(z)$ that is of form (or relates to the discrete transfer function) H(z). From this relationship, closed form expressions for the loop filter gains $K_1$ and $K_2$ can be derived.

The goal of the MPZ is to map the system that meets the performance requirements specified by $\omega_n$ and damping factor $\zeta$ to a corresponding model in the z-domain. The MPZ method directly maps the s-plane poles and zeros of an analog system to the corresponding z-plane poles and zeros of a discrete-time system. Here the Modified-MPZ (MMPZ) method is used as discussed in G. F. Franklin, J. D. Powell and A. Emami-Naeini, *Feedback Control of Dynamic Systems*, Addison-Wesley Reading, Mass., 1994, which can be described as follows:

1. Map the s-plane poles and zeros into the z-plane using the relationship, $z = e^{sT_s}$, where $T_s$ is the sampling interval.

The poles of H(s) at $s = -\zeta\omega_n + j\omega_n\sqrt{1-\zeta^2}$ will map to a pole of $H_2(z)$ at $$e^{T_s(-\zeta\omega_n + j\omega_n\sqrt{1-\zeta^2})}.$$

The poles of H(s) at $s = -\zeta\omega_n - j\omega_n\sqrt{1-\zeta^2}$ will map to a pole of $H_2(z)$ at $$e^{T_s(-\zeta\omega_n - j\omega_n\sqrt{1-\zeta^2})}.$$

The zero at $s = -\omega_n/2\zeta$ will map to a zero of $H_2(z)$ at $e^{-\omega_n T_s/2\zeta}$.

2. Form a discrete-time transfer function in z with the poles and zeros determined in the previous step.

$$H_2(z) = \frac{K_{DC}(z - e^{-\omega_n T_s/2\zeta})}{\left(z - e^{T_s\left(-\zeta\omega_n + j\omega_n\sqrt{1-\zeta^2}\right)}\right)\left(z - e^{T_s\left(-\zeta\omega_n - j\omega_n\sqrt{1-\zeta^2}\right)}\right)} \quad (27)$$

where $K_{DC}$ is the DC or low-frequency gain of $H_2(z)$.

3. Set the DC or low frequency gain of the discrete-time system $H_2(z)$ equal to that of the continuous-time system $H(s)$.

The Final Value Theorem (discussed in G. F. Franklin, J. D. Powell and A. Emami-Naeini, *Feedback Control of Dynamic Systems*, Addison-Wesley Reading, Mass., 1994) is often used to find the steady state value of a time function given its Laplace transform or z-transform. Suppose we have a function x(t), the theorem states, in the s-domain, that $$\lim_{t \to \infty} x(t) = \lim_{s \to 0} sX(s) \quad (28)$$

where X(s) is the Laplace transform of x(t) and as long as all the poles of sX(s) are in the left half-plane (LHP) of the s-plane. In the z-domain, the theorem states that $$\lim_{k \to \infty} x(kT_s) = \lim_{z \to 1}(1 - z^{-1})X(z) \quad (29)$$

where X(z) is the z-transform of x(t) and if all the poles of $(1z^1)X(z)$ are inside the unit circle. The theorem can also be use to find the DC gain of a system. The DC gain is the ratio of the output of a system to inputs input (presumed constant) after all transients have decayed. To find the DC gain, it is assumed there is a unit step input and the Final Value Theorem is used to compute the steady state value of the output. Therefore for a system with transfer function G(s), the DC gain is defined as $$\text{DC gain} = \lim_{s \to 0} sG(s)\frac{1}{s} = \lim_{s \to 0} G(s) \quad (30)$$

and for a system with transfer function G(z), the DC gain is defined as $$\text{DC gain} = \lim_{z \to 1}(1 - z^{-1})G(z)\frac{1}{1 - z^{-1}} = \lim_{z \to 1} G(z) \quad (31)$$

The DC gain of H(s) is obtained as $$\lim_{s \to 0} H(s) = 1$$

Setting the DC gain of ( )2 H z to that of H(s) we see that $$K_{DC} = 1.$$

Therefore, the transfer function $H_2(z)$ simplifies to $$H_2(z) = \frac{z - e^{-\omega_n T_s/2\zeta}}{\left(z - e^{T_s\left(-\zeta\omega_n + j\omega_n\sqrt{1-\zeta^2}\right)}\right)\left(z - e^{T_s\left(-\zeta\omega_n - j\omega_n\sqrt{1-\zeta^2}\right)}\right)} \quad (32)$$

The transfer function $H_2(z)$ can further be expressed as $$H_2(z) = \frac{z - e^{-\omega_n T_s/2\zeta}}{z^2 - 2e^{-2\zeta\omega_n T_s}\cos(\omega_n T_s\sqrt{1-\zeta^2}) + e^{-2\zeta\omega_n T_s}} \quad (33)$$

Now comparing the denominators (or characteristic functions) of H(z) and $H_2(z)$, we see that $$-K_{PD}K_{DO}K_1 = e^{-2\zeta\omega_n T_s} \quad (34)$$

$$K_1 = \frac{1}{K_{PD}K_{DO}}[1 - e^{-2\zeta\omega_n T_s}] \quad (35)$$

$$K_{PD}K_{DO}(K_1 + K_2) - 2 = -2e^{-2\zeta\omega_n T_s}\cos(\omega_n T_s\sqrt{1-\zeta^2}) \quad (36)$$

$$K_2 = \frac{1}{K_{PD}K_{DO}}[1 + e^{-2\zeta\omega_n T_s} - 2e^{-2\zeta\omega_n T_s}\cos(\omega_n T_s\sqrt{1-\zeta^2})] \quad (37)$$

Typically, performance specification for feedback control systems often involves certain requirements associated with the time response of the system. The setting time, $t_{set}$, is defined as the time it takes for the system transients to decay. For the PLL, $t_{set}$ is also referred to as the locking time (see R. E. Best, *Phase-Locked Loops. Design, Simulation, and Applications*, McGraw-Hill, New York, Fourth Edition, 1999). For the second-order system with 0 □□□1, the setting time (for the system to settle within 1% of the input amplitude) is given by $$t_{set} = \frac{4.6}{\zeta\omega_n} \quad (38)$$

as discussed in G. F. Franklin, J. D. Powell and A. Emami-Naeini, *Feedback Control of Dynamic Systems*, Addison-Wesley Reading, Mass., 1994.

Figure 27:
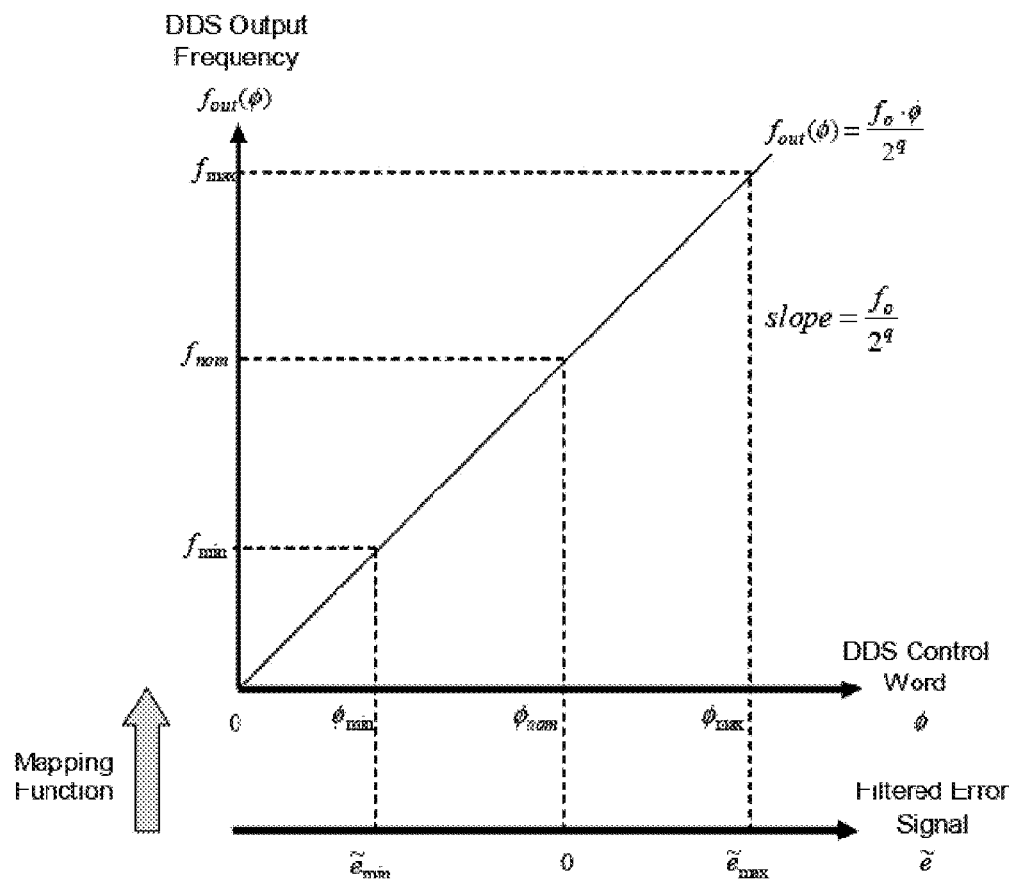
FIG. 27 shows the characteristics of a direct digital synthesizer of an embodiment of the present invention and its input mapping function.

Thus, for a second-order system, by specifying the settling time, $t_{set}$, and the damping factor (e.g., □□0.707), the undamped natural frequency □$_n$, and the filter gains $K_1$ and $K_2$ can easily be determined from the above equations. Then using the loop filter gains $K_1$ and $K_2$, and the error e(n), the filtered error signal ẽ(n) can be calculated. The filtered error can then be mapped to a corresponding DDS input using a mapping function as depicted in FIG. 27.

Comparison with Other Frequency Synchronization Techniques

The IEEE 1588 PTP based frequency recovery technique described in Section 12.1 of IEEE 1588-2008 Standard have been discussed above, as have other IEEE 1588 based techniques (such as those discussed in T. Neagoe and M. Hamdi; T. Neagoe M. Hamdi and V. Cristea; and S. Balasubramanian, K. R. Harris, A. Moldovansky—references above)

In contrast to the above techniques, the techniques described in the above embodiments of the present invention requires no path delay estimation as in the previous methods but simply the transmission and reception of PTP Sync messages (in one-step clock mode) and Follow-Up messages (in two-step clock mode). Since the techniques do not involve the estimation of path delays, the issue of path asymmetry does not arise. The techniques also work with variable message sizes and variable intermessage intervals unlike the other methods.

In the embodiments of the present invention, the clock recovery mechanism is implemented as a closed-loop feedback system in the form of a phase-locked loop (PLL) that locks to the incoming timestamps sent by the master. These techniques work even if Sync messages are sent at uneven intervals since the receiver PLL is initialized and controlled in such a way that its follows and tracks Sync messages whenever the arrive whether evenly spaced or unevenly spaced. This ability allows the proposed technique to handle Sync message losses and also cases where Sync message sizes are variable.

Since the techniques involve the transmission of PTP messages in- or out-of-band with data on the same communications channel, it provides a reliable way of delivering sync in both the indoor and outdoor environment, unlike GPS which is most applicable in the outdoor environment with clear visibility to GPS satellites.

The methods and systems described in the above embodiments are preferably combined and used in conjunction with each other.

The systems and methods of the above embodiments may be implemented in a computer system (in particular in computer hardware or in computer software) in addition to the structural components and user interactions described.

The term "computer system" includes the hardware, software and data storage devices for embodying a system or carrying out a method according to the above described embodiments. For example, a computer system may comprise a central processing unit (CPU), input means, output means and data storage. Preferably the computer system has a monitor to provide a visual output display (for example in the design of the business process). The data storage may comprise RAM, disk drives or other computer readable media. The computer system may include a plurality of computing devices connected by a network and able to communicate with each other over that network.

The methods of the above embodiments may be provided as computer programs or as computer program products or computer readable media carrying a computer program which is arranged, when run on a computer, to perform the method(s) described above.

The term "computer readable media" includes, without limitation, any medium or media which can be read and accessed directly by a computer or computer system. The media can include, but are not limited to, magnetic storage media such as floppy discs, hard disc storage media and magnetic tape; optical storage media such as optical discs or CD-ROMs; electrical storage media such as memory, including RAM, ROM and flash memory; and hybrids and combinations of the above such as magnetic/optical storage media.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

In particular, although the methods of the above embodiments have been described as being implemented on the systems of the embodiments described, the methods and systems of the present invention need not be implemented in conjunction with each other, but can be implemented on alternative systems or using alternative methods respectively.

All references referred to above are hereby incorporated by reference.

The invention claimed is:

1. A method of synchronizing the frequency of a slave clock in a slave device to a master clock in a master device, the method including the steps of:
   a) receiving in the slave device a first message from said master device having a first time-stamp which is a time-stamp of said master clock indicating the time of sending of said first message;
   b) extracting said first time-stamp from said first message and initializing a counter in the slave device which counts an output of said slave clock;
   c) receiving in the slave device a second message from said master device having a second time-stamp, which is a time-stamp of said master clock indicating the time of sending said second message, and reading the value of said counter at the time of receipt of said second message;
   d) extracting said second time-stamp from said second message;
   e) determining an error signal which is representative of the difference between said value of the counter and the difference between said first and second time-stamps; and
   f) adjusting the frequency of said slave clock based on said error signal.

2. The method according to claim 1 wherein the method repeats steps c) to f).

3. The method according to claim 1, further including the step of filtering said error signal prior to said step of adjusting.

4. The method according to claim 1 wherein said error signal is representative of the phase difference between said slave clock and said master clock.

5. The method according to claim 1 wherein said master clock is synchronized with a recognized standard time source.

6. An apparatus for synchronizing the frequency of a clock in a slave device which is communicatively coupled to a master device, the clock comprising:
   an oscillator; and
   a pulse counter counting pulses from said oscillator,
   the apparatus comprising:
   a receiver receiving messages from said master device;
   a time-stamp extraction device for extracting time-stamps applied to said messages by said master device; and
   a detector for detecting a difference between a time-stamp extracted from said messages and an output of said pulse counter and generating an error signal based on said difference,
   wherein:
   the receiver receives a first message from said master device having a first time-stamp which is a time-stamp of said master clock indicating the time of sending of said first message and initializes said pulse counter on receipt of said first message;
   the time-stamp extraction device extracts said first time-stamp from said first message;
   the receiver receives a second message from said master device having a second time-stamp, which is a time-stamp of said master clock indicating the time of sending said second message, and the detector reads the value of said pulse counter at the time of receipt of said second message;

the time-stamp extraction device extracts said second time-stamp from said second message;

the detector determines said error signal representative of the difference between said value of the counter and the difference between said first and second time-stamps; and said oscillator adjusts its frequency of oscillation based on said error signal.

7. The apparatus according to claim 6 wherein the apparatus receives a plurality of said messages from the master device and adjusts the frequency of the oscillator on receipt of each message.

8. The apparatus according to claim 6, further including a filter which filters said error signal prior to forming a control signal and wherein the oscillator adjusts its frequency of oscillation based on said control signal.

9. An apparatus according to claim 6 wherein said detector is a phase detector which detects the phase difference between said slave clock and said master clock.

10. The apparatus according to claim 6 wherein the oscillator, the pulse counter and the detector form a phase-locked loop.

11. The apparatus according to claim 6 wherein the oscillator is a voltage-controlled oscillator.

12. The apparatus according to claim 6 wherein the oscillator is a numerically controlled frequency synthesizer.

13. The apparatus according to claim 12 wherein the numerically controlled frequency synthesizer includes:
   a reference clock;
   a phase accumulator which increments a phase counter based on the output of said reference clock and said error signal; and
   a phase-to-amplitude conversion device for converting the value stored in said phase counter to an oscillating output.

14. The apparatus according to claim 13 wherein the numerically controlled frequency synthesizer further includes a digital-to-analog converter for converting said oscillating output to an analog oscillating output.

15. The apparatus according to claim 13 wherein the numerically controlled frequency synthesizer further includes a low-pass filter for smoothing said oscillating output.

16. A method of synchronizing the frequency of a slave clock in a slave device to a master clock in a master device, the method including the steps of:
   a) receiving in the slave device a first message from said master device having a first time-stamp, which is an approximate time-stamp of said master clock indicating the time of sending of said first message;
   b) extracting said first time-stamp from said first message and initializing a counter in the slave device which counts an output of said slave clock;
   c) receiving in the slave device a second message from said master device having a second time-stamp, which is a time-stamp of said master clock indicating the precise time of sending of said first message;
   d) extracting said second time-stamp from said second message;
   e) calculating a correction value, representative of the difference between the value of the first time-stamp and the value of the second time-stamp;
   f) receiving in the slave device a third message from said master device, and reading the value of said counter at the time of receipt of said third message;
   g) receiving in the slave device a fourth message from said master device having a third time-stamp, which is a time-stamp of said master clock indicating the precise time of sending said third message;
   h) extracting said third time-stamp from said fourth message;
   i) calculating an error signal, which is representative of the difference between the value of said counter, as read in step f) and said third time-stamp, adjusted using said correction value; and
   j) adjusting the frequency of said slave clock based on said error signal.

17. The method according to claim 16 wherein the method repeats steps f) to j).

18. The method according to claim 16, further including the step of filtering said error signal prior to said step of adjusting.

19. The method according to claim 16 wherein said error signal is representative of the phase difference between said slave clock and said master clock.

20. The method according to claim 16 wherein said master clock is synchronized with a recognized standard time source.

21. An apparatus for synchronizing the frequency of a clock in a slave device which is communicatively coupled to a master device, the clock comprising:
   an oscillator; and
   a pulse counter counting pulses from said oscillator,
the apparatus comprising:
   a receiver receiving messages from said master device;
   a time-stamp extraction device for extracting time-stamps applied to said messages by said master device;
   a calculator for calculating a difference between time-stamps; and
   a detector for detecting a difference between a time-stamp extracted from said messages and an output of said pulse counter and generating an error signal based on said difference,
wherein:
   the receiver receives a first message from said master device having a first time-stamp, which is a time-stamp of said master clock indicating the approximate time of sending of said first message;
   the time-stamp extraction device extracts said first time-stamp from said first message and initializes said pulse counter on receipt of said first message;
   the receiver receives a second message from said master device having a second time-stamp, which is a time-stamp of said master clock indicating the precise time of sending of said first message;
   the time-stamp extraction device extracts said second time-stamp from said second message;
   the calculator calculates a correction value, representative of the difference between the value of the first time-stamp and the value of the second time-stamp;
   the receiver receives a third message from said master device, and the detector reads the value of said counter at the time of receipt of said third message;
   the receiver receives a fourth message from said master device having a third time-stamp, which is a time-stamp of said master clock indicating the precise time of sending said third message;
   the time-stamp extraction device extracts said third time-stamp from said fourth message;
   the detector calculates an error signal, which is representative of the difference between the value of the counter, read by the detector, and said third time-stamp, adjusted using said correction value; and
   said oscillator adjusts its frequency of oscillation based on said error signal.

22. The apparatus according to claim 21 wherein the apparatus receives a plurality of said messages from the master device and adjusts the frequency of the oscillator on receipt of each message.

23. The apparatus according to claim 21, further including a filter which filters said error signal prior to forming a control signal and wherein the oscillator adjusts its frequency of oscillation based on said control signal.

24. The apparatus according to claim 21 wherein said detector is a phase detector which detects the phase difference between said slave clock and said master clock.

25. The apparatus according to claim 21 wherein the oscillator, the pulse counter and the detector form a phase-locked loop.

26. The apparatus according to claim 21 wherein the oscillator is a voltage-controlled oscillator.

27. The apparatus according to claim 21 wherein the oscillator is a numerically controlled frequency synthesizer.

28. The apparatus according to claim 27 wherein the numerically controlled frequency synthesizer includes:
    a reference clock;
    a phase accumulator which increments a phase counter based on the output of said reference clock and said error signal; and
    a phase-to-amplitude conversion device for converting the value stored in said phase counter to an oscillating output.

29. The apparatus according to claim 28 wherein the numerically controlled frequency synthesizer further includes a digital-to-analog converter for converting said oscillating output to an analog oscillating output.

30. The apparatus according to claim 28 wherein the numerically controlled frequency synthesizer further includes a low-pass filter for smoothing said oscillating output.

* * * * *

UNITED STATES PATENT AND TRADEMARK OFFICE
CERTIFICATE OF CORRECTION

Page 1 of 3

PATENT NO. : 8,913,632 B2
APPLICATION NO. : 13/204079
DATED : December 16, 2014
INVENTOR(S) : James Aweya et al.

It is certified that error appears in the above-identified patent and that said Letters Patent is hereby corrected as shown below:

In the specification

Column 11, line 60, after "$n$" please delete "□" and insert -- = --

Column 13, line 46, after "out" please delete "□" and insert -- = --

Column 14, line 16, after "number" please delete "□" and insert -- □ --

Column 14, line 18, after "number" please delete "□" and insert -- □ --

Column 14, line 53, after "modulo-" please delete "□" and insert -- □ --

Column 14, line 56, after "word" please delete "(□)" and insert -- (□) --

Column 14, line 64, after "a" please delete "□" and insert -- □ --

Column 14, line 66, after "the" please delete "□" and insert -- □ --

Column 15, line 10, before "=" please delete "□" and insert -- □ --

Column 15, line 13, after "of" please delete "□" and insert -- □ --

Column 15, line 48, after "increment" please delete "□" and insert -- □ --

Column 15, line 52, after "value" please delete "□" and insert -- □ --

Column 15, line 61, after "increment" please delete "□" and insert -- □ --

Column 15, line 64, after "$_{nom}$" please delete "□"and insert -- □ --

Signed and Sealed this
Thirty-first Day of May, 2016

Michelle K. Lee
*Director of the United States Patent and Trademark Office*

CERTIFICATE OF CORRECTION (continued)
U.S. Pat. No. 8,913,632 B2

Column 15, line 64, after "$f_{out}$" please delete "□"and insert -- = --

Column 15, line 66, after "quantity" please delete "□□ to □$_{nom}$ (i.e., □$_{DDS}$□□$_{nom}$□□)" and insert -- $- \Delta\square$ to $\square_{nom}$ (i.e., $\square_{DDS} = \square_{nom} - \Delta\square$) --

Column 15, line 67, after "$f_{nom}$" please delete "-□f." and insert -- $+ \Delta f$ --

Column 16, line 1, after "quantity" please delete "□□ to □nom (i.e., □$_{DDS}$□□$_{nom}$□□)" and insert -- $+ \Delta\square$ to $\square_{nom}$ (i.e., $\square_{DDS} = \square_{nom} + \Delta\square$) --

Column 16, line 2, after "$f_{nom}$" please delete "□" and insert -- $+ \Delta f$ --

Column 16, line 3, after "quantity" please delete "□□" and insert -- $\Delta\square$ --

Column 16, line 3, after "to" please delete "□" and insert -- □ --

Column 16, line 26, after "word" please delete "□" and insert -- □ --

Column 16, line 28, after "input" please delete "□" and insert -- □ --

Column 16, line 28, after "amount" please delete "□□" and insert -- $\Delta\square$ --

Column 16, line 56, after "DDS" please delete "□$_{out}$" and insert -- $\theta_{out}$ --

Column 16, line 57, after "variation" please delete "□□(n) □□$_{out}$(n) □□$_{nom}$□" and insert -- $\Delta\omega(n) = \omega_{out}(n) - \omega_{nom}$ --

Column 17, line 1, after "that" please delete "□$_{out}$□□□2□$f_0$ □□/ $2^q$" and insert -- $\omega_{out} = 2\pi f_0 \square / 2^q$ --

Column 17, line 2, after "$K_{DDS}$" please delete "□$d\square_{out}$/ $d\square\square 2\square f_0 /2^q$" and insert -- $= d\omega_{out} / d\square = 2\pi f_0 / 2^q$ --

Column 17, line 11, before "are" please delete "□$x(n\sim1))$, and □$_{DDS}^{(z)}$ and □$(z)$" and insert -- $= x(n-1)$ ), and $\Theta_{DDS}(z)$ and $\Phi(z)$ --

Column 17, line 12, please delete "□$_{out}$(n) and □□(n)" and insert -- $\theta_{out}(n)$ and $\Delta\square(n)$ --

Column 17, line 14, after "is" please delete "□$T(n)$ □□$T$" and insert -- $\Delta T(n) = \Delta T$ --

Column 17, line 16, after "every" please delete "□$T(n)$" and insert -- $\Delta T(n)$ --

Column 17, line 17, after "every" please delete "□$T$ interval, thus, □$T$" and insert -- $\Delta T$ interval, thus, $\Delta T$ --

Column 17, line 18, after "to" please delete "2□" and insert -- $2\pi$ --

CERTIFICATE OF CORRECTION (continued)
U.S. Pat. No. 8,913,632 B2

Column 17, line 20, after "to" please delete "2☐" and insert -- $2\pi$ --

Column 17, line 26, before "in" please delete "☐$_e(n)$" and insert -- $\theta_e(n)$ --

Column 17, line 45, after "difference" please delete "☐$_e(n)$" and insert -- $\theta_e(n)$ --

Column 17, line 46, before "between" please delete "☐☐$_{ref}(n)$~☐$_{out}(n)$" and insert -- $= \theta_{ref}(n) - \theta_{out}(n)$ --

Column 17, line 46, after "phase" please delete "☐$_{out}$(n)" and insert -- $\theta_{out}(n)$ --

Column 17, line 47, after "phase" please delete "☐$_{ref}(n)$" and insert -- $\theta_{ref}(n)$ --

Column 17, line 48, after "difference" please delete "☐$_e(n)$" and insert -- $\theta_e(n)$ --

Column 17, line 49, after "of" please delete "☐$_e(n)$ are ~☐☐☐$_e(n)$ ☐☐" and insert -- $\theta_e(n)$ are $-\pi < \theta_e(n) < \pi$ --

Column 17, line 51, please delete "$e(n)=K_{PD}$☐☐$e(n)$☐" and insert -- $e(n) = K_{PD} \cdot \theta_e(n)$ --

Column 18, line 61, after "where" please delete "☐$_{VCO}(s)$, ☐$_{ref}(s)$, and ☐$_e(s)$" and insert -- $\Theta_{VCO}(s)$, $\Theta_{ref}(s)$, and $\Theta_e(s)$ --

Column 18, line 62, after "phase" please delete "☐$_{VCO}(t)$, reference signal phase ☐$_{ref}(t)$" and insert -- $\theta_{VCO}(t)$, reference signal phase $\theta_{ref}(t)$ --

Column 18, line 63, after "error" please delete "☐$_e(t)$" and insert -- $\theta_e(t)$ --

Column 19, line 17, after "simply" please delete "☐$_e(☐)$" and insert -- $\theta_e(\infty)$ --

Column 19, line 32, after "where" please delete "☐$_1$and ☐$_2$" and insert -- $\tau_1$ and $\tau_2$ --

Column 19, line 33, after "at" please delete "s☐0" and insert -- $s = 0$ --

UNITED STATES PATENT AND TRADEMARK OFFICE
CERTIFICATE OF CORRECTION

PATENT NO. : 8,913,632 B2
APPLICATION NO. : 13/204079
DATED : December 16, 2014
INVENTOR(S) : James Aweya et al.

It is certified that error appears in the above-identified patent and that said Letters Patent is hereby corrected as shown below:

In the specification

Column 11, line 60, after "$n$" please delete "☐" and insert -- = --

Column 13, line 46, after "out" please delete "☐" and insert -- = --

Column 14, line 16, after "number" please delete "☐" and insert -- $\phi$ --

Column 14, line 18, after "number" please delete "☐" and insert -- $\phi$ --

Column 14, line 53, after "modulo-" please delete "☐" and insert -- $\phi$ --

Column 14, line 56, after "word" please delete "(☐)" and insert -- ($\phi$) --

Column 14, line 64, after "a" please delete "☐" and insert -- $\phi$ --

Column 14, line 66, after "the" please delete "☐" and insert -- $\phi$ --

Column 15, line 10, before "=" please delete "☐" and insert -- $\phi$ --

Column 15, line 13, after "of" please delete "☐" and insert -- $\phi$ --

Column 15, line 48, after "increment" please delete "☐" and insert -- $\phi$ --

Column 15, line 52, after "value" please delete "☐" and insert -- $\phi$ --

Column 15, line 61, after "increment" please delete "☐" and insert -- $\phi$ --

This certificate supersedes the Certificate of Correction issued May 31, 2016.

Signed and Sealed this
Twelfth Day of July, 2016

Michelle K. Lee
*Director of the United States Patent and Trademark Office*

CERTIFICATE OF CORRECTION (continued)

Column 15, line 64, after "$_{nom}$" please delete "☐" and insert -- $\phi$ --

Column 15, line 64, after "$f_{out}$" please delete "☐" and insert -- = --

Column 15, line 66, after "quantity" please delete "☐☐ to ☐$_{nom}$ (i.e., ☐$_{DDS}$☐☐$_{nom}$☐☐)" and insert -- $-\Delta\phi$ to $\phi_{nom}$ (i.e., $\phi_{DDS} = \phi_{nom} - \Delta\phi$) --

Column 15, line 67, after "$f_{nom}$" please delete "-☐f." and insert -- $+ \Delta f$ --

Column 16, line 1, after "quantity" please delete "☐☐to ☐nom (i.e., ☐$_{DDS}$☐☐$_{nom}$☐☐)" and insert -- $+ \Delta\phi$ to $\phi_{nom}$ (i.e., $\phi_{DDS} = \phi_{nom} + \Delta\phi$) --

Column 16, line 2, after "$f_{nom}$" please delete "☐" and insert -- $+ \Delta f$ --

Column 16, line 3, after "quantity" please delete "☐☐" and insert -- $\Delta\phi$ --

Column 16, line 3, after "to" please delete "☐" and insert -- $\phi$ --

Column 16, line 26, after "word" please delete "☐" and insert -- $\phi$ --

Column 16, line 28, after "input" please delete "☐" and insert -- $\phi$ --

Column 16, line 28, after "amount" please delete "☐☐" and insert -- $\Delta\phi$ --

Column 16, line 56, after "DDS" please delete "☐$_{out}$" and insert -- $\theta_{out}$ --

Column 16, line 57, after "variation" please delete "☐☐($n$) ☐☐$_{out}$($n$) ☐☐$_{nom}$☐" and insert -- $\Delta\omega(n) = \omega_{out}(n) - \omega_{nom}$ --

Column 17, line 1, after "that" please delete "☐$_{out}$☐☐☐2☐$f_0$ ☐☐/ $2^q$" and insert -- $\omega_{out} = 2\pi f_0 \phi / 2^q$ --

Column 17, line 2, after "$K_{DDS}$" please delete "☐$d$☐$_{out}$/ $d$☐☐2☐$f_0$ /$2^q$" and insert -- $= d\omega_{out} / d\phi = 2\pi f_0 / 2^q$ --

Column 17, line 11, before "are" please delete "☐$x(n\sim 1)$), and ☐$_{DDS}^{(z)}$ and ☐($z$)" and insert -- $= x(n-1)$ ), and $\Theta_{DDS}(z)$ and $\Phi(z)$ --

Column 17, line 12, please delete "☐$_{out}$(n) and ☐☐($n$)" and insert -- $\theta_{out}(n)$ and $\Delta\phi(n)$ --

Column 17, line 14, after "is" please delete "☐$T(n)$ ☐☐$T$" and insert -- $\Delta T(n) = \Delta T$ --

Column 17, line 16, after "every" please delete "☐$T(n)$" and insert -- $\Delta T(n)$ --

Column 17, line 17, after "every" please delete "☐$T$ interval, thus, ☐$T$" and insert -- $\Delta T$ interval, thus, $\Delta T$ --

Column 17, line 18, after "to" please delete "2☐" and insert -- $2\pi$ --

Column 17, line 20, after "to" please delete "2☐" and insert -- $2\pi$ --

Column 17, line 26, before "in" please delete "☐$_e(n)$" and insert -- $\theta_e(n)$ --

Column 17, line 45, after "difference" please delete "☐$_e(n)$" and insert -- $\theta_e(n)$ --

Column 17, line 46, before "between" please delete "☐☐$_{ref}(n)$~☐$_{out}(n)$" and insert -- $= \theta_{ref}(n) - \theta_{out}(n)$ --

Column 17, line 46, after "phase" please delete "☐$_{out}(n)$" and insert -- $\theta_{out}(n)$ --

Column 17, line 47, after "phase" please delete "☐$_{ref}(n)$" and insert -- $\theta_{ref}(n)$ --

Column 17, line 48, after "difference" please delete "☐$_e(n)$" and insert -- $\theta_e(n)$ --

Column 17, line 49, after "of" please delete "☐$_e(n)$ are ~☐☐☐$_e(n)$ ☐☐" and insert -- $\theta_e(n)$ are $-\pi < \theta_e(n) < \pi$ --

Column 17, line 51, please delete "$e(n)=K_{PD}$☐$_e(n)$☐" and insert -- $e(n) = K_{PD} \cdot \theta_e(n)$ --

Column 18, line 61, after "where" please delete "☐$_{VCO}(s)$, and ☐$_{ref}(s)$, ☐$_e(s)$" and insert -- $\Theta_{VCO}(s)$, and $\Theta_{ref}(s)$, $\Theta_e(s)$ --

Column 18, line 62, after "phase" please delete "☐$_{VCO}(t)$, reference signal phase ☐$_{ref}(t)$" and insert -- $\theta_{VCO}(t)$, reference signal phase $\theta_{ref}(t)$ --

Column 18, line 63, after "error" please delete "☐$_e(t)$" and insert -- $\theta_e(t)$ --

Column 19, line 17, after "simply" please delete "☐$_e($☐$)$" and insert -- $\theta_e(\infty)$ --

Column 19, line 32, after "where" please delete "☐$_1$ and ☐$_2$" and insert -- $\tau_1$ and $\tau_2$ --

Column 19, line 33, after "at" please delete "$s$☐0" and insert -- $s = 0$ --